(12) United States Patent
Tseng et al.

(10) Patent No.: US 10,269,637 B2
(45) Date of Patent: Apr. 23, 2019

(54) SEMICONDUCTOR STRUCTURE AND FABRICATING METHOD THEREOF

(71) Applicant: TAIWAN SEMICONDUCTOR MANUFACTURING CO., LTD., Hsinchu (TW)

(72) Inventors: Lee-Chuan Tseng, New Taipei (TW); Lung-Yuan Pan, Hsinchu (TW); Chung-Yen Chou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/643,510

(22) Filed: Jul. 7, 2017

(65) Prior Publication Data

US 2018/0158732 A1 Jun. 7, 2018

Related U.S. Application Data

(60) Provisional application No. 62/429,100, filed on Dec. 2, 2016.

(51) Int. Cl.
| | |
|---|---|
| *H01L 21/311* | (2006.01) |
| *H01L 21/768* | (2006.01) |
| *H01L 49/02* | (2006.01) |
| *H01L 21/306* | (2006.01) |
| *H01L 21/3065* | (2006.01) |

(52) U.S. Cl.
CPC .... *H01L 21/76898* (2013.01); *H01L 21/3065* (2013.01); *H01L 21/30604* (2013.01); *H01L 28/88* (2013.01)

(58) Field of Classification Search
CPC .......... H01L 21/76898; H01L 21/3065; H01L 21/30604
USPC ......................................... 438/694, 713, 716
See application file for complete search history.

(56) References Cited

U.S. PATENT DOCUMENTS

| | | | |
|---|---|---|---|
| 6,770,210 B2* | 8/2004 | Hashimoto | H01L 43/12 216/22 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,816,431 B2* | 8/2014 | Bowers | H01L 29/407 257/330 |
| 8,993,380 B2 | 3/2015 | Hou et al. | |
| 9,142,614 B2* | 9/2015 | Liu | H01L 29/0649 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,984,918 B2* | 5/2018 | Su | H01L 21/764 |
| 2010/0013060 A1* | 1/2010 | Lamy | H01L 21/76898 257/621 |

(Continued)

*Primary Examiner* — Hsien Ming Lee
(74) *Attorney, Agent, or Firm* — McClure, Qualey & Rodack, LLP

(57) ABSTRACT

A semiconductor structure includes a substrate, a hole which includes a top hole and a bottom hole in communication with each other in the substrate, and a filler in the top hole and the bottom hole, wherein the top hole tapers toward the bottom hole, and a side surface of the top hole and a side surface of the bottom hole form an obtuse angle.

20 Claims, 25 Drawing Sheets

(56) References Cited

U.S. PATENT DOCUMENTS

2011/0169086 A1\* 7/2011 Grisham .......... H01L 21/76232
  257/347

\* cited by examiner

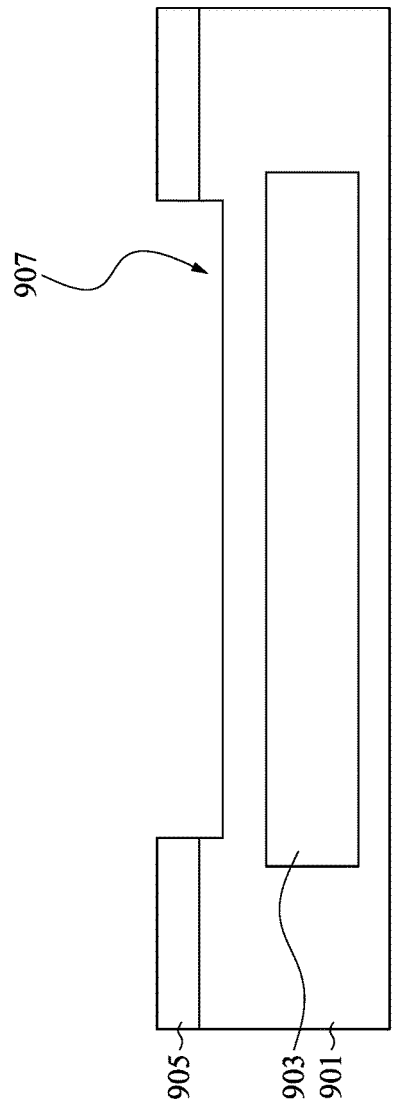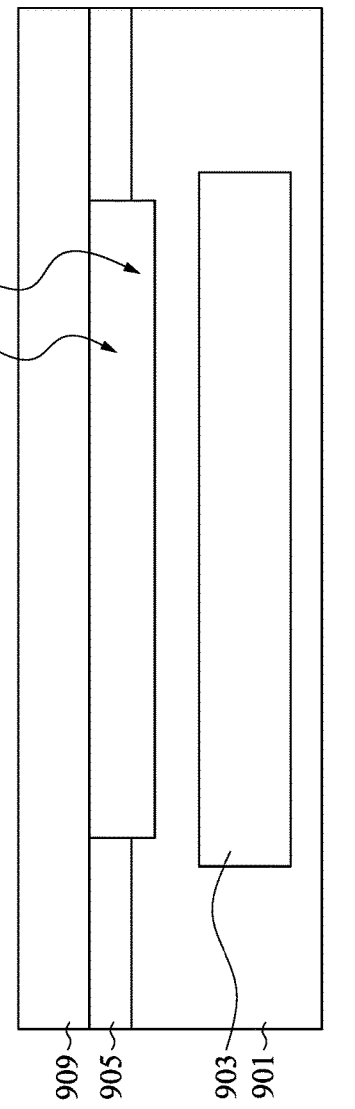
Fig. 9A
Fig. 9B

SEMICONDUCTOR STRUCTURE AND FABRICATING METHOD THEREOF

PRIORITY CLAIM AND CROSS-REFERENCE

This application claims priority of U.S. provisional application Ser. No. 62/429,100, which was filed on Dec. 2, 2016, the entire disclosure of which is incorporated herein by reference.

BACKGROUND

To achieve increased density and performance of integrated circuits (ICs), the characteristic size of features on those circuits is decreased. Fabrication of IC devices introduces new challenges in process development and control.

During fabricating features, such as through-silicon vias (TSVs) and trench capacitors, the fabricating process may include forming trenches or holes in a substrate and then filling materials in the trenches or holes. Additional metal lines and/or metal pads are then formed over and electrically coupled to the TSVs, for example, using damascene processes. TSVs may also be formed after all metal layers and passivation layers are formed, and may be formed from the front side or the back side of the respective wafers/chips, which approaches are referred to as via-last approaches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A to 9F are cross-sectional views of a method for manufacturing a semiconductor structure at various stages in accordance with some embodiments of the instant disclosure.

DETAILED DESCRIPTION

Figure 1:
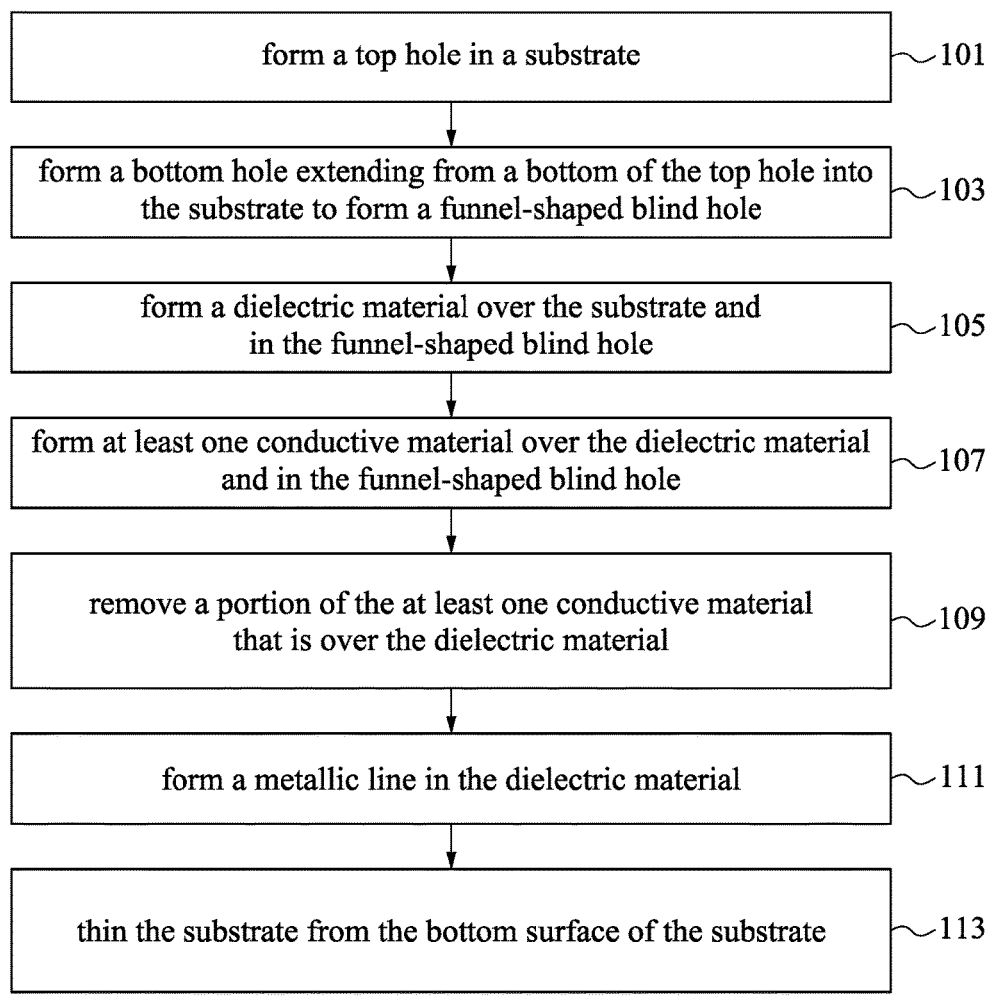
FIG. 1 is a flowchart of a method of fabricating a semiconductor structure in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a flowchart of a method 100 of fabricating a semiconductor structure in accordance with some exemplary embodiments of the instant disclosure. Operation 101 of the method is forming a top hole in a substrate. The method continues with operation 103 in which a bottom hole extending from a bottom of the top hole into the substrate is formed to form a funnel-shaped blind hole. Operation 105, a dielectric material is formed over the substrate and in the funnel-shaped blind hole. The method continues with operation 107 in which at least one conductive material is formed over the dielectric material and in the funnel-shaped blind hole. The method continues with operation 109 in which a portion of the at least one conductive material that is over the dielectric material is removed. The method continues with operation 111 in which a metallic line is formed in the dielectric material. Operation 113, the substrate is thinned from the bottom surface of the substrate. It is understood that FIG. 1 has been simplified for a good understanding of the concepts of the instant disclosure. Accordingly, it should be noted that additional processes may be provided before, during, and after the methods of FIG. 1, and that some other processes may only be briefly described herein.

FIGS. 2A to 2G are cross-sectional views of a method for manufacturing a semiconductor structure 200 at various stages in accordance with some embodiments of the instant disclosure.

Figure 2A:
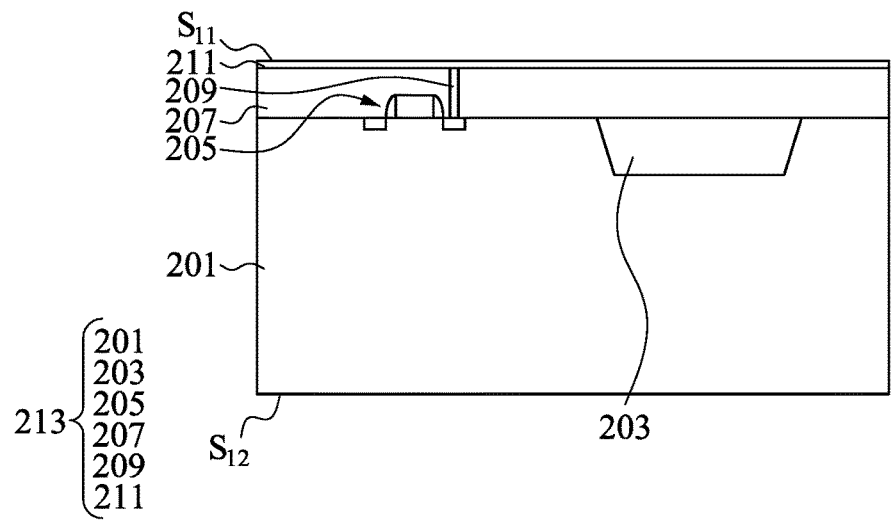
FIGS. 2A to 2G are cross-sectional views of a method for manufacturing a semiconductor structure at various stages in accordance with some embodiments of the instant disclosure.
Figure 2B:
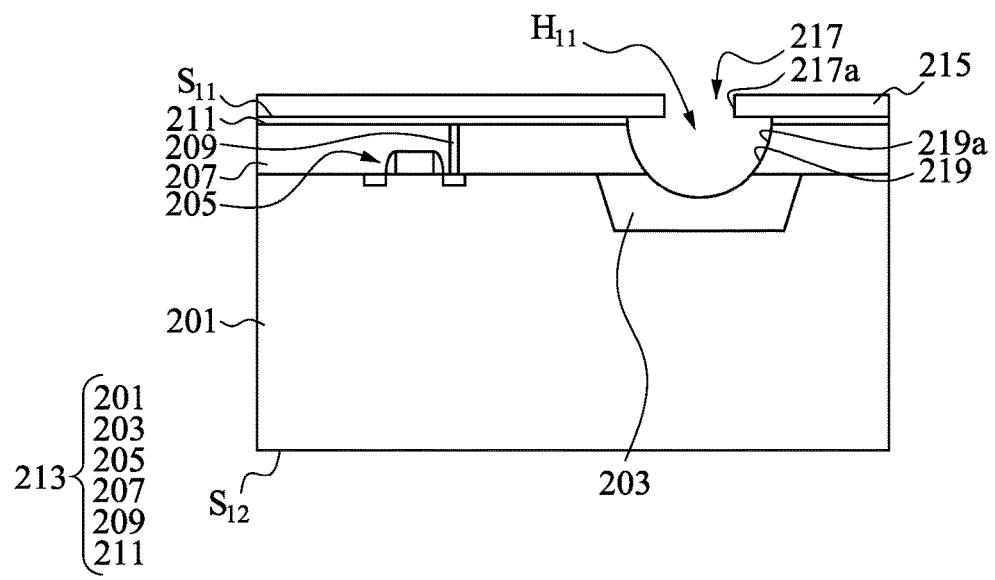

Reference is made to FIGS. 2A and 2B. A top hole $H_{11}$ is formed in a substrate 213 (the operation 101 of FIG. 1). As shown in FIG. 2A, the substrate 213 includes a semiconductor substrate 201, at least one isolation structure, e.g., an isolation structure 203, at least one transistor, e.g., a transistor 205, a dielectric layer 207, at least one contact plug, e.g., a contact plug 209, and an etch stop layer 211.

In some embodiments, the semiconductor substrate 201 may include an elementary semiconductor including silicon or germanium in a crystalline, a polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the alloy semiconductor substrate may have a gradient SiGe feature in which the Si and Ge composition change from one ratio at one location to another ratio at another location of the gradient SiGe feature. In some other embodiments, the alloy SiGe is formed over a silicon substrate. In still some other embodiments, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Still referring to FIG. 2A, the isolation structure 203 is formed in the semiconductor substrate 201. In some embodiments, the isolation structure 203 can be a shallow trench isolation (STI) structure, a local oxidation of silicon (LOCOS) structure, and/or combinations thereof. The isolation structure 203 can be made of at least one material, such as silicon oxide, silicon nitride, silicon oxynitride, other dielectric materials, and/or combinations thereof. The transistor 205 is formed over the semiconductor substrate 201. The dielectric layer 207 is formed over the semiconductor substrate 201, the isolation structure 203, and the transistor 205. In some embodiments, the dielectric layer 207 can be made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, a low-k material, and/or any combinations thereof. In some embodiments, the dielectric layer 207 is referred to as an inter-layer dielectric (ILD) layer. In some embodiments, a multiple-layer dielectric structure can be formed over the semiconductor substrate 201. The contact plug 209 is formed in the dielectric layer 207 to electrically connect with the transistor 205. The etch stop layer 211 is formed over the dielectric layer 207. In some embodiments, the etch-stop layer 211 can be made of a material including at least one of, for example, nitride, oxynitride, carbide, oxycarbide, other dielectric materials having an etch selectivity substantially different from that of the dielectric layer 207, and/or combinations thereof. It is noted that though merely showing a single etch-stop layer 211 in FIG. 1, the scope of this application is not limited thereto. In some embodiments, a multiple-layer etch-stop structure can be formed over the dielectric layer 207.

As shown in FIG. 2B, a patterned mask layer 215 which has an opening 217 is formed on a top surface $S_{11}$ of the substrate 213. An etching process, e.g., an isotropic etching process, by using the patterned mask layer 215 as an etch mask, can remove a portion of the substrate 213 to form the top hole $H_{11}$ which is a blind hole. In some embodiments, the isotropic etching process is a wet etching process. In FIG. 2B, portions of the etch stop layer 211, the dielectric layer 207, and the isolation structure 203 are removed to form the top hole $H_{11}$. However, it is noted that the scope of this application is not limited thereto. The height of the top hole $H_{11}$ can be adjusted.

More specifically, the top hole $H_{11}$ has a width decreases from top to bottom. In other words, the top hole $H_{11}$ tapers from the top surface $S_{11}$ of the substrate 213 toward the bottom surface $S_{11}$ of the substrate 213. In some embodiments, the top hole $H_{11}$ is formed by etching the substrate 213 through the opening 217 by an isotropic etching process. Because the isotropic etching etches horizontally as well as vertically into the top surface $S_{11}$ of the substrate 213, as shown in FIG. 2B, the top hole $H_{11}$ is substantially bowl-shaped. In other words, the top hole $H_{11}$ is concave. Accordingly, an inner surface 219 of the top hole $H_{11}$ is concave, and a side surface 219a of the inner surface 219 of the top hole $H_{11}$ is also concave. It is noted that the scope of this application is not limited thereto. The shape of the top hole $H_{11}$ can be adjusted by using another etching process. In some other embodiments, the cross section of the top hole $H_{11}$ is substantially inverted trapezoidal, and the side surface of the top hole $H_{11}$ is substantially straight. In some other embodiments, the top hole $H_{11}$ has a convex side surface. The term "substantially" as used herein may be applied to modify any quantitative representation which could permissibly vary without resulting in a change in the basic function to which it is related.

Figure 2C:
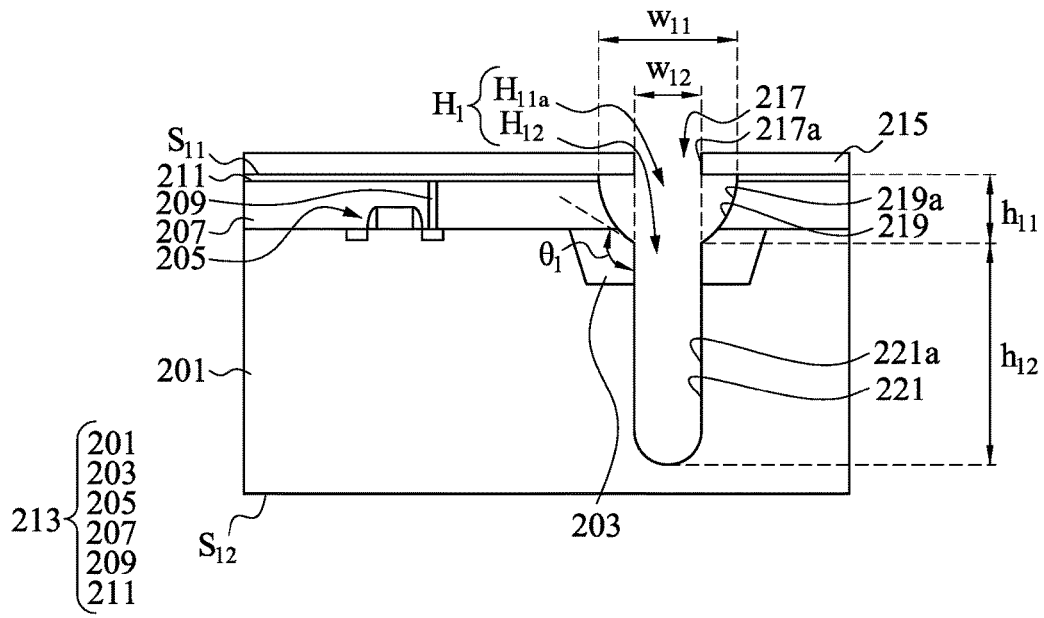

Reference is made to FIG. 2C. A bottom hole $H_{12}$ extending from a bottom of the top hole $H_{11}$ into the substrate 213 is formed to form a funnel-shaped blind hole $H_1$ (the operation 103 of FIG. 1). In other words, forming the bottom hole $H_{12}$ stops before the bottom hole $H_{12}$ penetrates through the substrate 213. The top hole $H_{11}$ in communication with the bottom hole $H_{12}$ is referred to as a top hole $H_{11a}$. An etching process, e.g., an anisotropic etching process, by using the patterned mask layer 215 as an etch mask, can remove a portion of the substrate 213 to form the bottom hole $H_{12}$. In FIG. 2C, portions of the isolation structure 203 and the semiconductor substrate 201 are removed to form the bottom hole $H_{12}$. It is noted that the scope of this application is not limited thereto. The height of the bottom hole $H_{12}$ can be adjusted. In some embodiments, the anisotropic etching process is dry etching process, e.g., deep reactive-ion etching (DRIE), which is used to form deep penetration, steep-sided holes and trenches in wafers/substrates, typically with high aspect ratios. For example, DRIE is Bosch etching or cryogenic etching. After forming the funnel-shaped blind hole $H_1$, the patterned mask layer 215 is removed.

In some embodiments, the bottom hole $H_{12}$ is formed by etching the substrate 213 through the opening 217 by an anisotropic etching process. Because the anisotropic etching etches in a single direction into the surface of the substrate 213, as shown in FIG. 2C, the bottom hole $H_{12}$ is a substantially straight hole. In some embodiments, a side surface 221a of an inner surface 221 of the bottom hole $H_{12}$ is substantially straight. In some embodiments, the side surface 221a of the inner surface 221 of the bottom hole $H_{12}$ substantially aligns with the side surface 217a of the opening 217 of the patterned mask layer 215. It is noted that the side surface 219a of the top hole $H_{11a}$ and the side surface 221a of the bottom hole $H_{12}$ form an obtuse angle $\theta_1$ as shown in FIG. 2C.

Still referring to FIG. 2C, the top hole $H_{11a}$ has a first top width $w_{11}$ and a first height $h_{11}$. In some embodiments, the ratio of the first height $h_{11}$ to the first top width $w_{11}$ is about 0.5 to about 2. In some embodiments, the first top width $w_{11}$ ranges from about 0.2 to about 15 μm. In some embodiments, the first height $h_{11}$ ranges from about 0.1 to about 10 μm. The bottom hole $H_{12}$ has a second top width $w_{12}$ and a second height $h_{12}$. The second height $h_{12}$ is greater than the first height $h_{11}$. In some embodiments, the ratio of the second height $h_{12}$ to the second top width $w_{12}$ is about 1 to about 20. In some embodiments, the second top width $w_{12}$ ranges from about 0.1 to about 10 μm. In some embodiments, the second height $h_{12}$ ranges from about 1 to about 200 μm.

As shown in FIG. 2C, the first top width $w_{11}$ of the top hole $H_{11a}$ is greater than the second top width $w_{12}$ of the bottom hole $H_{12}$, and thus the upper portion (i.e., the top hole $H_{11a}$) of the funnel-shaped blind hole $H_1$ is wider than the lower portion (i.e., the bottom hole $H_{12}$) of the funnel-shaped blind hole $H_1$. Such shape of the funnel-shaped blind hole $H_1$ is good for filling material, such as conductive material and dielectric material, into the funnel-shaped blind hole $H_1$ without causing seams or voids in the material. During the filling process, the material can be deposited on the inner surface of the funnel-shaped blind hole $H_1$ to fill the funnel-shaped blind hole $H_1$, such that the material disposed in the funnel-shaped blind hole $H_1$ has a smooth and planar top surface.

Figure 2D:
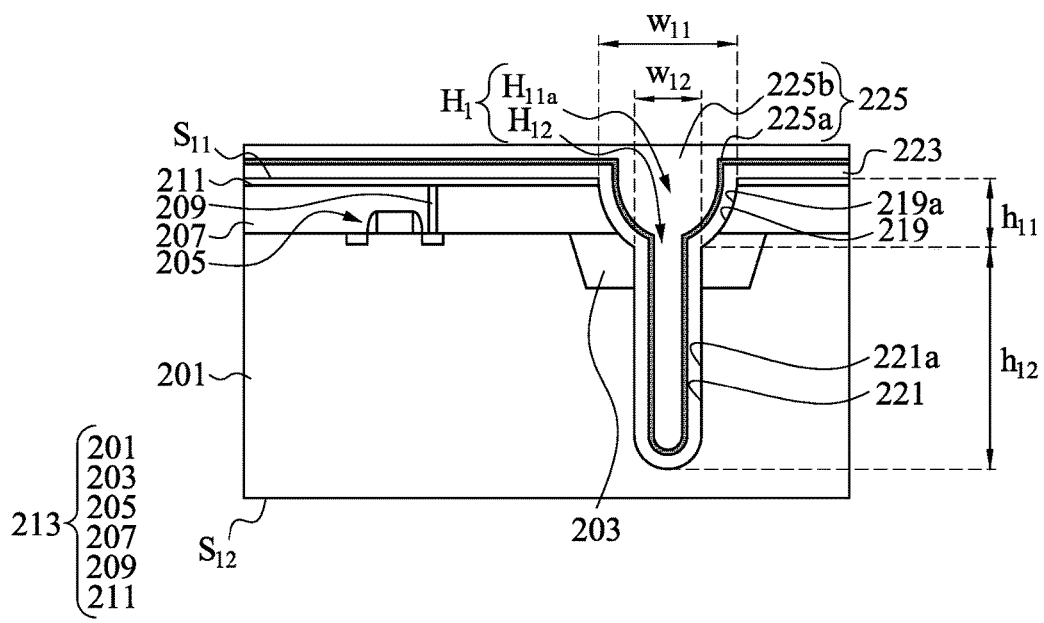

Attention is now invited to FIG. 2D. A dielectric material 223 is formed over the substrate 213 and in the funnel-shaped blind hole $H_1$, and at least one conductive material 225 is formed over the dielectric material 223 and in the funnel-shaped blind hole $H_1$ (the operation 105 and 107 of FIG. 1). In some embodiments, the dielectric material 223 and the at least one conductive material 225 are referred as a filler. Accordingly, the operation 105 and 107 also can be regarded as forming a filler in the top hole $H_{11a}$ and the bottom hole $H_{12}$. As shown in FIG. 2D, the dielectric material 223 continuously extends over the substrate 213 and into the funnel-shaped blind hole $H_1$. More specifically, the dielectric material 223 is conformally disposed in the top hole $H_{11a}$ and the bottom hole $H_{12}$, and in contact with the inner surface 219 of the top hole $H_{11a}$ and the inner surface 221 of the bottom hole $H_{12}$. Similarly, the at least one conductive material 225 conformally covers the dielectric material 223. In some embodiments, the at least one conductive material 225 includes a barrier metallic material 225a and a metallic material 225b as shown in FIG. 2D. The barrier metallic material 225a can be formed by, for example, chemical vapor deposition (CVD), physical vapor deposition (PVD), atomic layer deposition (ALD), and/or other suitable processes. The metallic material 225b can be formed by, for example, CVD, electroplating, and/or other suitable processes to fill the metallic material 225b in the funnel-shaped blind hole $H_1$.

Because the top hole $H_{11a}$ is wider than the bottom hole $H_{12}$, the funnel-shaped blind hole $H_1$ have a good filling performance with the dielectric material 223 and the at least one conductive material 225. Moreover, there can be no seam or void in the dielectric material 223 and the at least one conductive material 225, and in some embodiments, the at least one conductive material 225 has a substantially planar top surface. In other words, the dielectric material 223 and the at least one conductive material 225 can be seam-free and void-free.

Figure 2E:
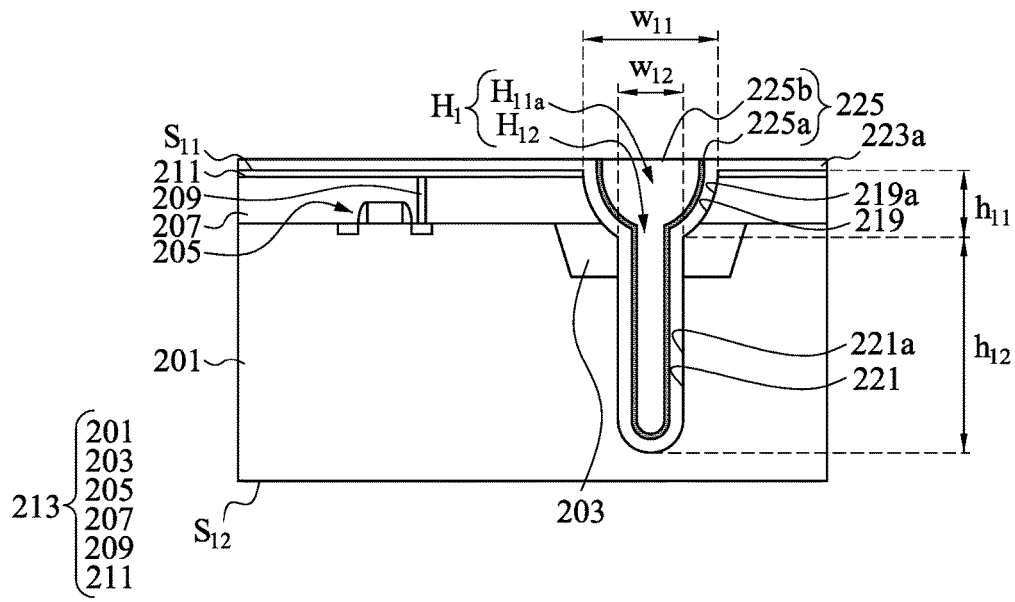

Please refer to FIG. 2E. A portion of the at least one conductive material 225 that is over the dielectric material 223 is removed. (the operation 109 of FIG. 1). In some embodiments, the at least one conductive material 225 is removed by a chemical mechanical polish (CMP) process, a dry etching process, and/or combinations thereof. In some embodiments, a portion of the dielectric material 223 that is under the at least one conductive material 225 and outside the funnel-shaped blind hole $H_1$ is removed after the removing process. The remaining portion of the dielectric material 223 is referred to as a dielectric material 223a.

Figure 2F:
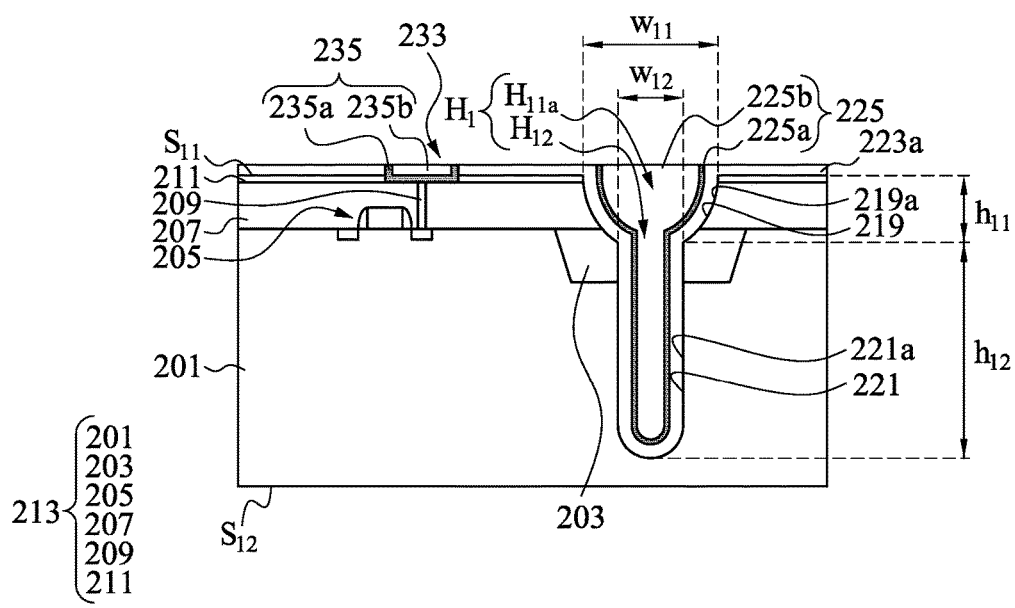

Turning now to FIG. 2F, a metallic line 235 is formed in the dielectric material 223a (the operation 111 of FIG. 1). In some embodiments, forming the metallic line 235 includes the following operations. A cap layer (not shown) is formed over the dielectric material 223a and the at least one conductive material 225. The cap layer may be made of at least one material that is similar to or the same as the material of the etch stop layer 211. A patterned mask layer (not shown) is formed on the cap layer. The patterned mask layer has at least one opening that exposes a portion of the cap layer. Portions of the cap layer, the dielectric material 223a, and the etch stop layer 211 are removed by an etching process to form an opening 233 to expose the contact plug 209, and the patterned mask layer is removed. A barrier metallic material layer and a metallic material layer are formed in the opening 233 and over the remaining cap layer. The remaining cap layer and portions of the barrier metallic material layer and the metallic material layer are removed to expose the dielectric material 223a and to form the metallic line 235 in the opening 233. In some embodiments, the metallic line 235 includes a barrier metallic material layer 235a and a metallic material layer 235b disposed on the barrier metallic material layer 235a.

Figure 2G:
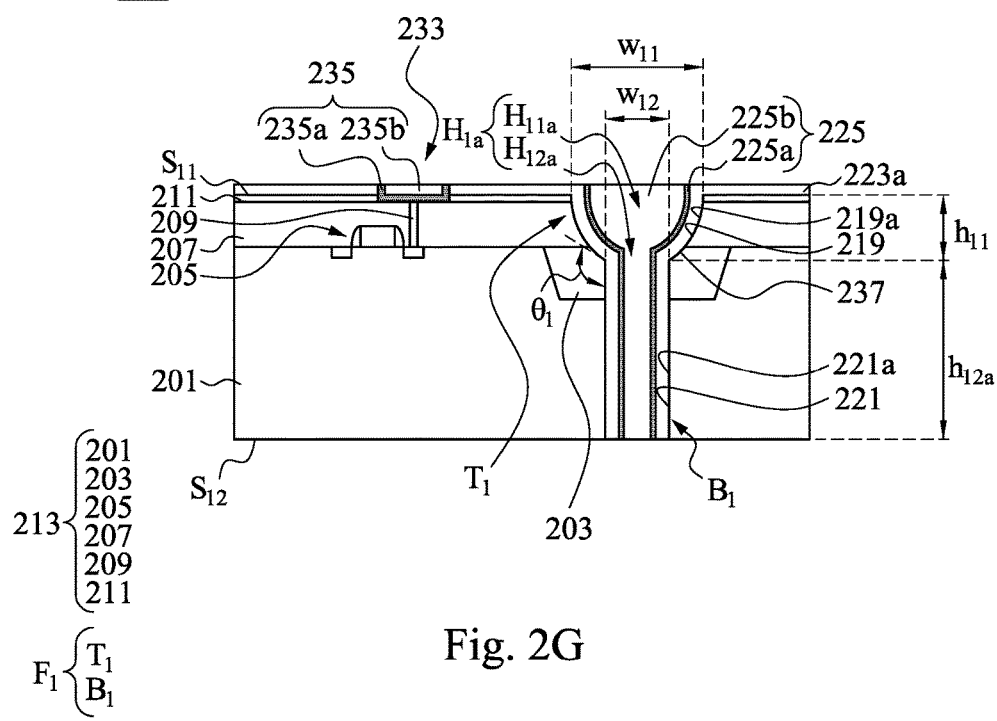

Attention is now invited to FIG. 2G. The substrate 213 is thinned from the bottom surface $S_{12}$ of the substrate 213 to expose the at least one conductive material 225. (the operation 113 of FIG. 1). In FIG. 2G, a portion of the at least one conductive material 225 is also removed. Accordingly, the semiconductor structure 200 is formed. It is noted that, after the operation 113, the shape of the bottom hole $H_{12}$ is changed, and the shape of the funnel-shaped blind hole $H_1$ is changed accordingly. The changed bottom hole $H_{12}$ is referred to as a bottom hole $H_{12a}$ which has a second height $h_{12a}$ shorter than the second height $h_{12}$ of the bottom hole $H_{12}$. The changed funnel-shaped blind hole $H_1$ is referred to as a funnel-shaped through hole $H_{1a}$.

As shown in FIG. 2G, the semiconductor structure 200 includes the substrate 213, the dielectric material 223a, the at least one conductive material 225, and the metallic line 235. The substrate 213 includes the semiconductor substrate 201, the isolation structure 203, the transistor 205, the dielectric layer 207, the contact plug 209, and the etch stop layer 211. The substrate 213 has the top surface $S_{11}$ and the bottom surface $S_{12}$, and has the funnel-shaped through hole $H_{1a}$ therein. The funnel-shaped through hole $H_{1a}$ extends through the substrate 213 between the top surface $S_{11}$ and the bottom surface $S_{12}$. The funnel-shaped through hole $H_{1a}$ has the top hole $H_{11a}$ and the bottom hole $H_{12a}$ under the top hole $H_{11a}$. The top hole $H_{11a}$ and the bottom hole $H_{12a}$ are in communication with each other. The side surface 219a of the top hole $H_{11a}$ and the side surface 221a of the bottom hole $H_{11a}$ form the obtuse angle $\theta_1$. The top hole $H_{11a}$ has the first top width $w_{11}$ greater than the second top width $w_{12}$ of the bottom hole $H_{12a}$. Moreover, the top hole $H_{11a}$ tapers from the top surface $S_{11}$ toward the bottom hole $H_{12a}$ (or the bottom surface $S_{12}$). In some embodiments, the side surface 219a of the top hole $H_{11a}$ is curved. In FIG. 2G, the side surface 219a of the top hole $H_{11a}$ is concave. In some other embodiments, the side surface of the top hole $H_{11a}$ is convex or substantially straight. The dielectric material 223a is conformally disposed in the top hole $H_{11a}$ and the bottom hole $H_{12a}$, and in contact with the inner surface 219 of the top hole $H_{11a}$, the inner surface 221 of the bottom hole $H_{12a}$, and the top surface $S_{11}$ of the substrate 213. The at least one conductive material 225 is disposed on the dielectric material 223a and in the top hole $H_{11a}$ and the bottom hole $H_{12a}$. In other words, the at least one conductive material 225 penetrating through the substrate 213 is in the funnel-shaped through hole $H_{1a}$, and is surrounded by the dielectric material 223a. Accordingly, the funnel-shaped through hole $H_{1a}$ is filled with the dielectric material 223a and the at least one conductive material 225. In some embodiments, the at least one conductive material 225 includes the barrier metallic material 225a and the metallic material 225b. In some embodiments, the at least one conductive material 225 is referred to as a through-substrate via (TSV) structure. The transistor 205 is disposed over the semiconductor substrate 201. The metallic line 235 is disposed in the dielectric material 223a and includes the barrier metallic material layer 235a and the metallic material layer 235b. The contact plug 209 is electrically coupled between the transistor 205 and the metallic line 235.

Still referring to FIG. 2G, as previously described, in some embodiments, the dielectric material 223 and the at least one conductive material 225 are referred as a filler. Moreover, the dielectric material 223a is formed from the dielectric material 223. Therefore, alternatively, the semiconductor structure 200 includes a filler $F_1$ disposed in the top hole $H_{11a}$ and the bottom hole $H_{12a}$. The filler $F_1$ includes a top portion $T_1$ (i.e., the portion of the dielectric material 223a and the at least one conductive material 225 filled in the top hole $H_{11a}$) and a bottom portion $B_1$ (i.e., the portion of the dielectric material 223a and the at least one conductive material 225 filled in the bottom hole $H_{12a}$) in contact with the top portion $T_1$. As shown in FIG. 2G, the top portion $T_1$ has a convex side surface 237 extending from a top of the top portion $T_1$ to a top of the bottom portion $B_1$, and has the first top width $w_{11}$ greater than the second top width $w_{12}$ of the bottom portion $B_1$.

Figure 3:
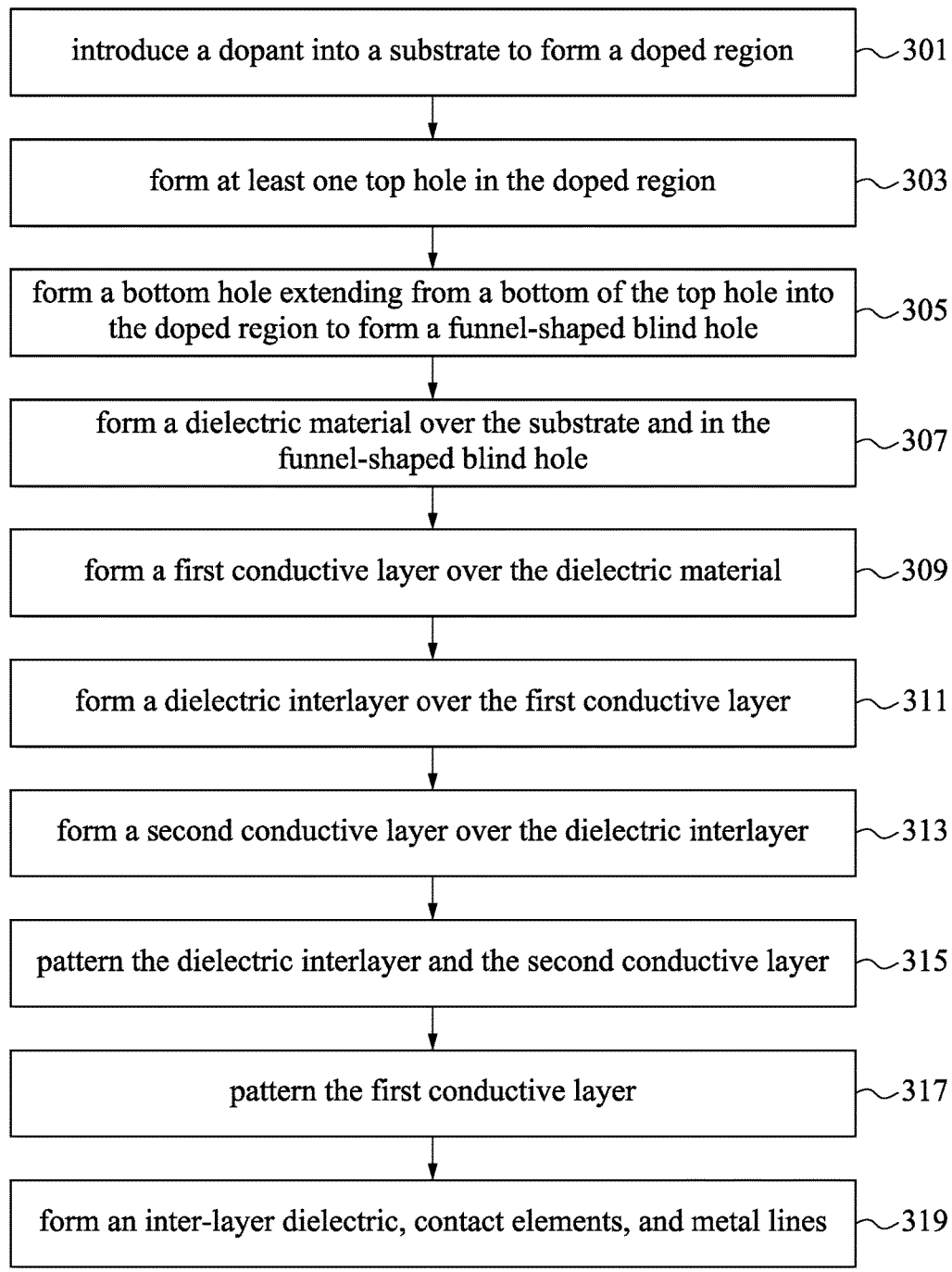
FIG. 3 is a flowchart of a method of fabricating a semiconductor structure in accordance with some embodiments of the instant disclosure.

FIG. 3 is a flowchart of a method 300 of fabricating a semiconductor structure in accordance with some exemplary embodiments of the instant disclosure. Operation 301 of the method is introducing a dopant into a substrate to form a doped region. The method continues with operation 303 in which at least one top hole is formed in the doped region. Operation 305, a bottom hole extending from a bottom of the top hole into the doped region is formed to form a funnel-shaped blind hole. The method continues with operation 307 in which a dielectric material is formed over the substrate and in the funnel-shaped blind hole. The method continues with operation 309 in which a first conductive layer is formed over the dielectric material. The method continues with operation 311 in which a dielectric interlayer is formed over the first conductive layer. Operation 313, a second conductive layer is formed over the dielectric interlayer. The method continues with operation 315 in which the dielectric interlayer and the second conductive layer are patterned. Operation 317, the first conductive layer is patterned. In operation 319, an inter-layer dielectric (ILD), contact elements, and metal lines are formed. It is understood that FIG. 3 has been simplified for a good understanding of the concepts of the instant disclosure. Accordingly, it should be noted that additional processes may be provided before, during, and after the methods of FIG. 3, and that some other processes may only be briefly described herein.

FIGS. 4A to 4G are cross-sectional views of a method for manufacturing a semiconductor structure 400 at various stages in accordance with some embodiments of the instant disclosure.

Figure 4A:
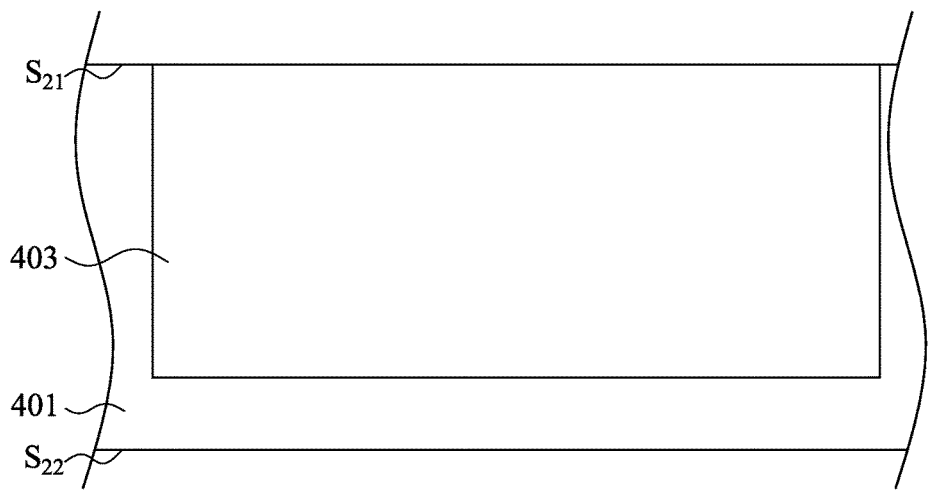
FIGS. 4A to 4G are cross-sectional views of a method for manufacturing a semiconductor structure at various stages in accordance with some embodiments of the instant disclosure.

Reference is made to FIG. 4A. A dopant is introduced into a substrate 401 to form a doped region 403 (operation 301 of FIG. 3). The substrate 401 may be made of at least one material that is similar to or the same as the material of the semiconductor substrate 201. The doped region 403 may be an N-type doped region or a P-type doped region. In some embodiments, the doped region 403 is an N-type doped region formed by implanting an N-type dopant into the substrate 401. For instance, phosphor is implanted in the substrate 310 to form the doped region 403. Alternatively, other N-type dopants such as arsenic and antimony may be used in the ion implantation process.

Figure 4B:
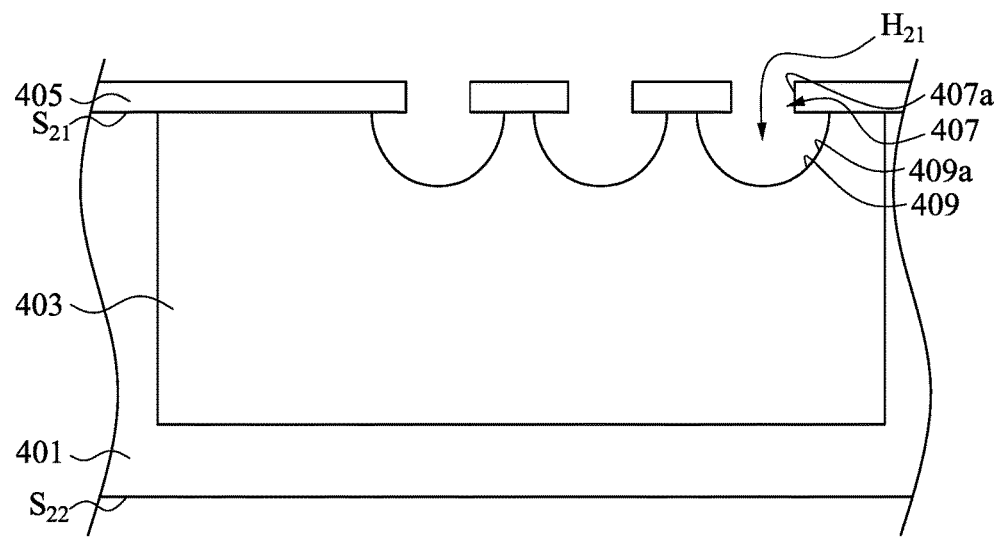

Reference is made to FIG. 4B. At least one top hole $H_{21}$ is formed in the doped region 403 of the substrate 401 (operation 303 of FIG. 3). More specifically, a patterned mask layer 405 which has at least one opening 407 is formed on the doped region 403. An etching process, e.g., an isotropic etching process, by using the patterned mask layer 405 as an etch mask, can remove at least a portion of the doped region 403 to form the top hole $H_{21}$. The top hole $H_{21}$ is a blind hole. In some embodiments, the isotropic etching process is a wet etching process.

The top hole $H_{21}$ has a width decreases from top to bottom. In other words, the top hole $H_{21}$ tapers from the top surface $S_{21}$ of the substrate 401 toward the bottom surface $S_{22}$ of the substrate 401. In some embodiments, the top hole $H_{21}$ is formed by etching the doped region 403 of the substrate 401 through the opening 407 by an isotropic etching process. Accordingly, the top hole $H_{21}$ is substantially bowl-shaped. In other words, the top hole $H_{21}$ is concave. Accordingly, an inner surface 409 of the top hole $H_{21}$ is concave, and a side surface 409a of the inner surface 409 of the top hole $H_{21}$ is also concave. It is noted that the scope of this application is not limited thereto. The shape of the top hole $H_{21}$ can be adjusted by using another etching process. In some other embodiments, the cross section of the top hole $H_{21}$ is substantially inverted trapezoidal, and the side surface of the top hole $H_{21}$ is substantially straight. In still some other embodiments, the top hole $H_{21}$ has a convex side surface.

Figure 4C:
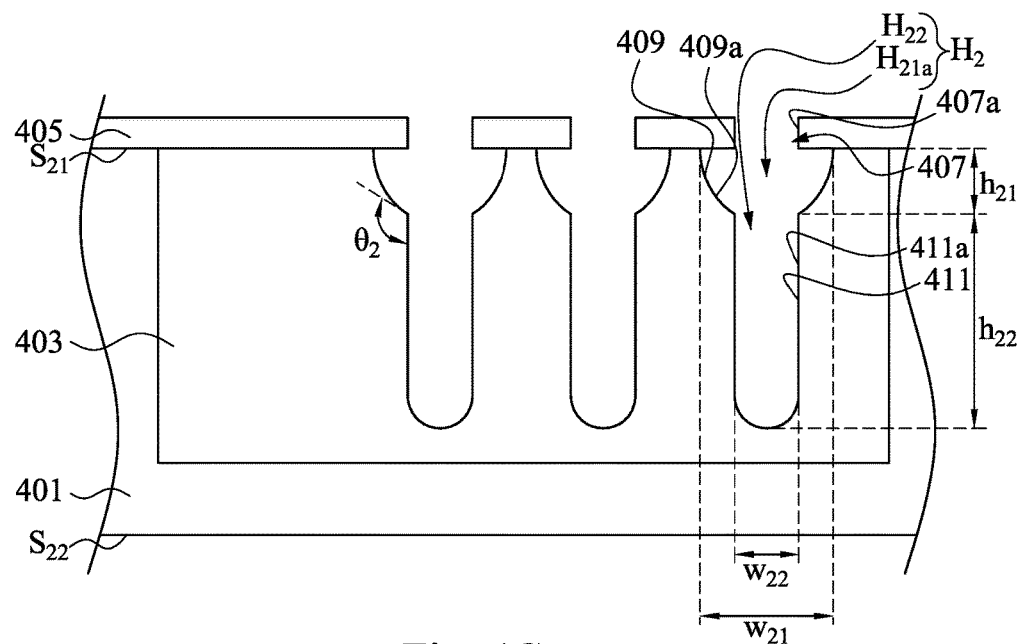

Reference is made to FIG. 4C. A bottom hole $H_{22}$ extending from a bottom of the top hole $H_{21}$ into the doped region 403 is formed to form a funnel-shaped blind hole $H_2$ (operation 305 of FIG. 3). In other words, forming the bottom hole $H_{22}$ stops before the bottom hole $H_{22}$ penetrates through the doped region 403 of the substrate 401. The top hole $H_{21}$ in communication with the bottom hole $H_{22}$ is referred to as a top hole $H_{21a}$. An etching process, e.g., an anisotropic etching process, by using the patterned mask layer 405 as an etch mask, can remove a portion of the doped region 403 to form the bottom hole $H_{22}$. In some embodiments, the anisotropic etching process is dry etching process, e.g., deep reactive-ion etching (DRIE). For example, DRIE is Bosch etching or cryogenic etching. After forming the funnel-shaped blind hole $H_2$, the patterned mask layer 405 is removed.

In some embodiments, the bottom hole $H_{22}$ is formed by etching the doped region 403 of the substrate 401 through the opening 407 by an anisotropic etching process. Accordingly, the bottom hole $H_{22}$ is a substantially straight hole. In some embodiments, a side surface 411a of an inner surface 411 of the bottom hole $H_{12}$ is substantially straight. In some embodiments, the side surface 411a of the inner surface 411 of the bottom hole $H_{22}$ substantially aligns with a side surface 407a of the opening 407 of the patterned mask layer 405. It is noted that the side surface 409a of the top hole $H_{21a}$ and the side surface 411a of the bottom hole $H_{22}$ form an obtuse angle $\theta_2$ as shown in FIG. 4C.

Still referring to FIG. 4C, the top hole $H_{21a}$ has a first top width $w_{21}$ and a first height $h_{21}$. In some embodiments, the ratio of the first height $h_{21}$ to the first top width $w_{21}$ is about 0.5 to about 2. In some embodiments, the first top width $w_{21}$ ranges from about 0.2 to about 15 μm. In some embodiments, the first height $h_{21}$ ranges from about 0.1 to about 10 μm. The bottom hole $H_{22}$ has a second top width $w_{22}$ and a second height $h_{22}$. The second height $h_{22}$ is greater than the first height $h_{21}$. In some embodiments, the ratio of the second height $h_{22}$ to the second top width $w_{22}$ is about 1 to about 20. In some embodiments, the second top width $w_{22}$ ranges from about 0.1 to about 10 μm. In some embodiments, the second height $h_{22}$ ranges from about 1 to about 200 μm.

As shown in FIG. 4C, the first top width $w_{21}$ of the top hole $H_{21a}$ is greater than the second top width $w_{22}$ of the bottom hole $H_{22}$, and thus the upper portion (i.e., the top hole $H_{21a}$) of the funnel-shaped blind hole $H_2$ is wider than the lower portion (i.e., the bottom hole $H_{22}$) of the funnel-shaped blind hole $H_2$. Such shape of the funnel-shaped blind hole $H_2$ is good for filling material, such as conductive material and dielectric material, into the funnel-shaped blind hole $H_2$ without causing seams or voids in the material. During the filling process, the material can be deposited on the inner surface of the funnel-shaped blind hole $H_2$ to fill the funnel-shaped blind hole $H_2$, such that the material disposed in the funnel-shaped blind hole $H_2$ has a smooth and planar top surface.

Figure 4D:
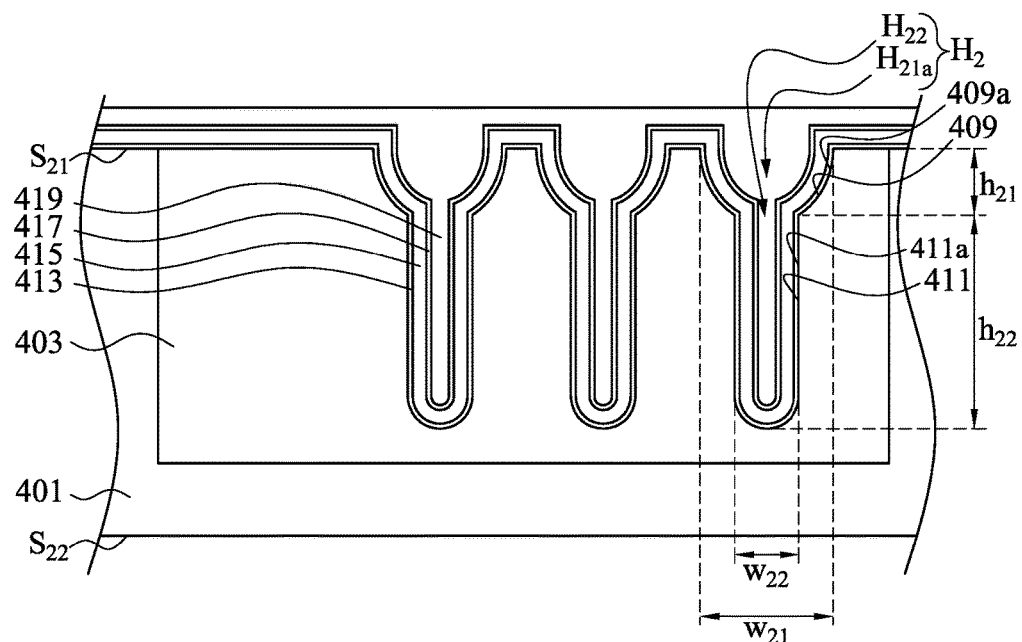

Attention is now invited to FIG. 4D. A dielectric material 413 is formed over the substrate 401 and in the funnel-shaped blind hole $H_2$, a first conductive layer 415 is formed over the dielectric material 413, a dielectric interlayer 417 is formed over the first conductive layer 415, and a second conductive layer 419 is formed over the dielectric interlayer 417 (the operations 307-313 of FIG. 3). In some embodiments, the dielectric material 413, the first conductive layer 415, the dielectric interlayer 417, and the second conductive layer 419 are referred as a filler. Accordingly, the operations 307-313 also can be regarded as forming a filler in the top hole $H_{21a}$ and the bottom hole $H_{22}$. The dielectric material 413 continuously extends over the substrate 401 and into the funnel-shaped blind hole $H_2$. More specifically, the dielectric material 413 is conformally disposed in the top hole $H_{21a}$ and the bottom hole $H_{22}$, and in contact with the inner surface 409 of the top hole $H_{21a}$ and the inner surface 411 of the bottom hole $H_{22}$. The first conductive layer 415 conformally covers the dielectric material 413, the dielectric interlayer 417 conformally covers the first conductive layer 415, and the second conductive layer 419 conformally covers the dielectric interlayer 417. The funnel-shaped blind hole $H_2$ is filled with the dielectric material 413, the first conductive layer 415, the dielectric interlayer 417, and the second conductive layer 419.

Because the top hole $H_{21a}$ is wider than the bottom hole $H_{22}$, the funnel-shaped blind hole $H_1$ can be filled with the dielectric material 413, the first conductive layer 415, the dielectric interlayer 417, and the second conductive layer 419. Moreover, there is no seam or void in the dielectric material 413, the first conductive layer 415, the dielectric interlayer 417, and the second conductive layer 419. In some embodiments, the second conductive layer 419 has a substantially planar top surface. In other words, the stack including the dielectric material 413, the first conductive layer 415, the dielectric interlayer 417, and the second conductive layer 419 can be seam-free and void-free.

Figure 4E:
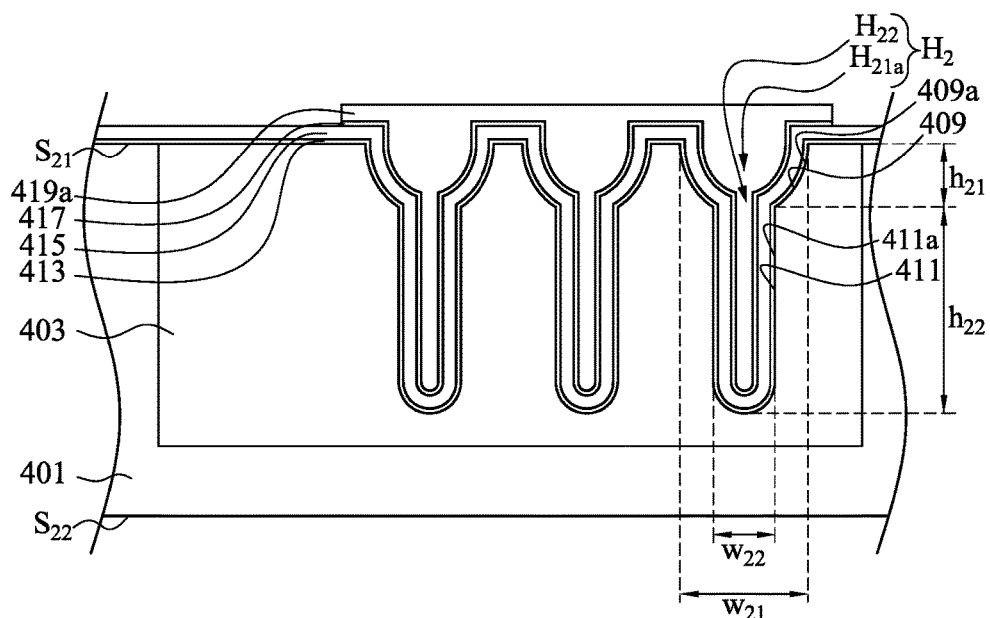

Please refer to FIG. 4E. The dielectric interlayer 417 and the second conductive layer 419 are patterned (the operation 315 of FIG. 3). More specifically, the second conductive layer 419 and the dielectric interlayer 417 therebeneath are patterned to define a top electrode 419a over the funnel-shaped blind hole $H_2$ and expose a portion of the first conductive layer 415. For example, a patterned mask layer (not shown) is formed on the second conductive layer 419. A portion of the second conductive layer 419, which is not covered by the patterned mask layer, and a portion of the dielectric interlayer 417 are removed to define the top electrode 419a. In some embodiments, a dry etching process may be performed to remove the portions of the second conductive layer 419 and the dielectric interlayer 417.

Figure 4F:
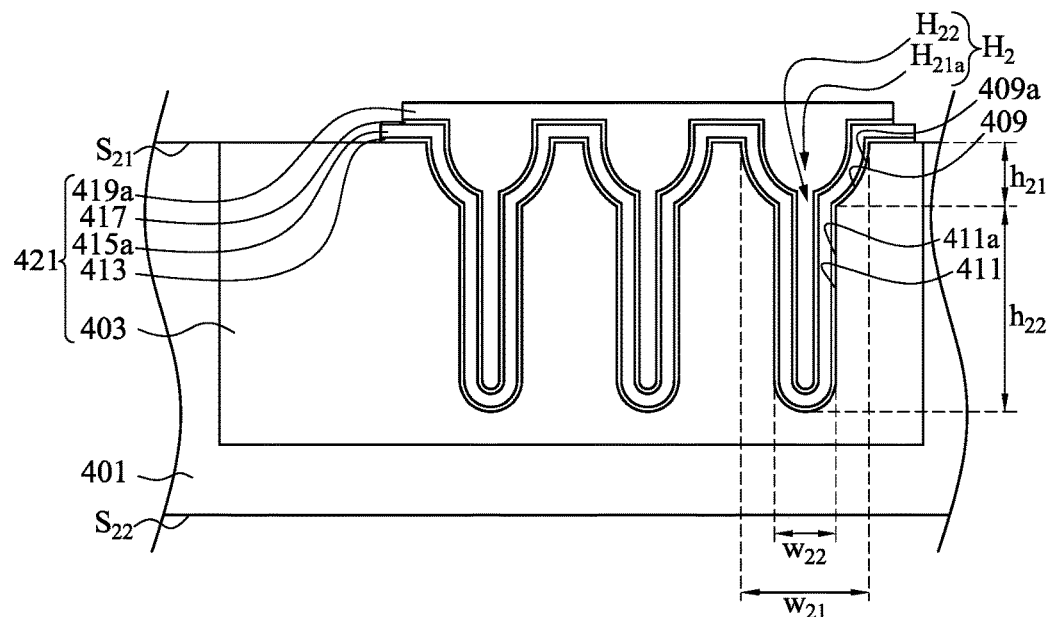

Turning now to FIG. 4F, the first conductive layer 415 is patterned (the operation 317 of FIG. 3). A portion of the first conductive layer 415 is patterned to define a bottom electrode 415a beneath the top electrode 419a. The doped region 403, the dielectric material 413, the bottom electrode 415a, the dielectric interlayer 417 and the top electrode 419a constitute a capacitor 421. The dielectric material 413 may be selectively patterned. In FIG. 4F, the operation 317 further includes patterning the dielectric material 413 beneath the first conductive layer 415. In some other embodiments, the dielectric material 413 is not patterned (not shown).

Figure 4G:
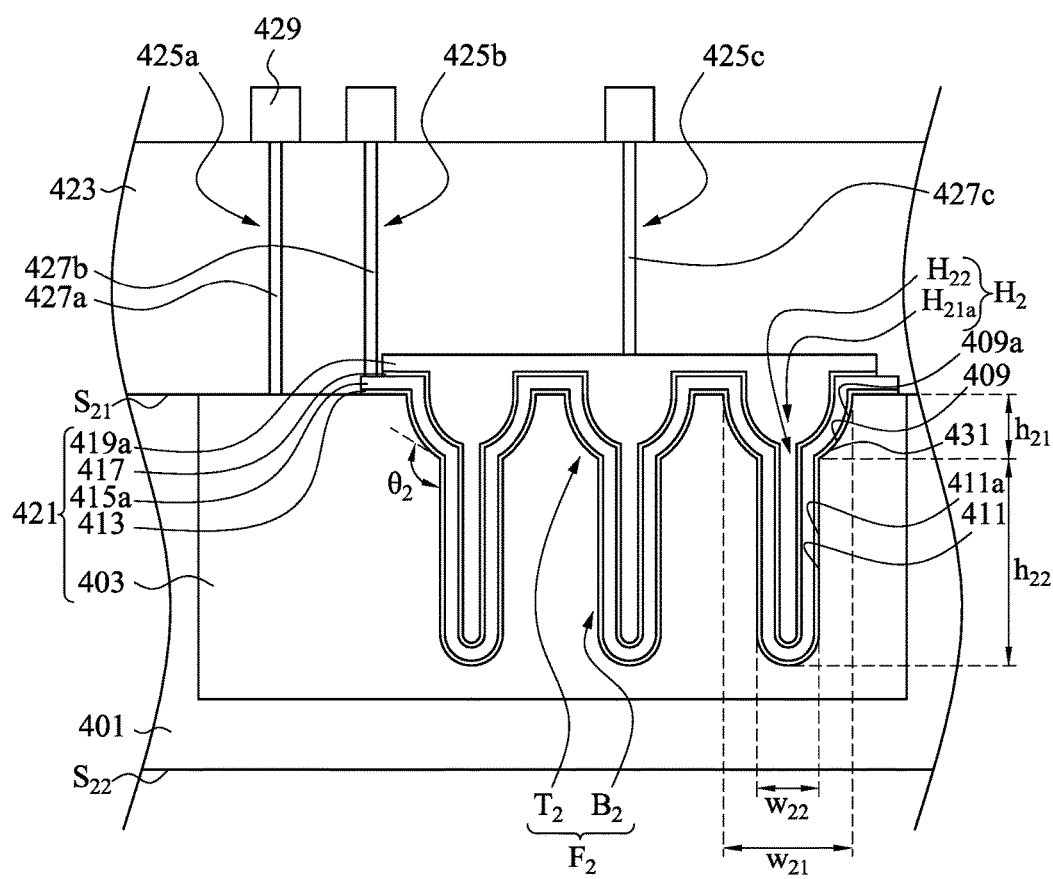

Attention is now invited to FIG. 4G. A patterned inter-layer dielectric (ILD) layer 423, contact elements, 427a, 427b and 427c, and metal lines 429 are formed (the operation 319 of FIG. 3). More specifically, an ILD layer (not shown) is formed over the capacitor 421. The ILD layer may be formed by deposition, such as PECVD, LPCVD or APCVD. The ILD layer is patterned to form the patterned inter-layer dielectric 423 which has a plurality of contact windows 425a, 425b and 425c respectively exposing a portion of the doped region 403, a portion of the bottom electrode 415a and a portion of the top electrode 419a. A plurality of contact elements 427a, 427b and 427c are respectively formed in the contact windows 425a, 425b and 425c to contact the doped region 403, the bottom electrode 415a and the top electrode 419a, as shown in FIG. 4G. In some embodiments, the contact elements 427a, 427b and 427c are made of tungsten and formed by deposition. The metal lines 429 may be formed on the top surface of the patterned ILD layer 423 to respectively contact the contact elements 427a, 427b and 427c. Accordingly, the semiconductor structure 400 is formed.

As shown in FIG. 4G, the semiconductor structure 400 includes the substrate 401, the dielectric material 413, the bottom electrode 415a, the dielectric interlayer 417, the top electrode 419a, the patterned inter-layer dielectric 423, the contact elements 427a, 427b and 427c, and the metal lines 429. The substrate 401 includes the doped region 403. The doped region 403 extends from the top surface $S_{21}$ of the substrate 401 toward the bottom surface $S_{22}$ of the substrate 401, and has a top surface and a bottom surface. The doped region 403 of the substrate 401 has the funnel-shaped blind hole $H_2$ therein. The funnel-shaped blind hole $H_2$ is disposed in the doped region 403, and extends from the top surface of the doped region 403 toward the bottom surface of the doped region 403. The funnel-shaped blind hole $H_2$ includes the top hole $H_{21a}$ and the bottom hole $H_{22}$ in communication with each other. The side surface 409a of the top hole $H_{21a}$ and the side surface 411a of the bottom hole $H_{22}$ form the obtuse angle $\theta_2$. The top hole $H_{21a}$ has the first top width $w_{21}$ greater than the second top width $w_{22}$ of the bottom hole $H_{22}$. Moreover, the top hole $H_{21a}$ tapers from the top surface of the doped region 403 toward the bottom hole $H_{22}$ (or the bottom surface of the doped region 403). In some embodiments, the side surface 409a of the top hole $H_{21a}$ is curved. In FIG. 4G, the side surface 409a of the top hole $H_{21a}$ is concave. In some other embodiments, the side surface of the top hole $H_{21a}$ is convex or substantially straight. The dielectric material 413 is conformally disposed in the top hole $H_{21a}$ and the bottom hole $H_{22}$, and covers the side surface 409a of the top hole $H_{21a}$, the inner surface 411 of the bottom hole $H_{22}$, and the top surface of the doped region 403. The bottom electrode 415a is conformally disposed on the dielectric material 413 and at least partially in the top hole $H_{21a}$ and the bottom hole $H_{22}$. The dielectric interlayer 417 is conformally disposed on the bottom electrode 415a and at least partially in the top hole $H_{21a}$ and the bottom hole $H_{22}$. The top electrode 419a is disposed on the dielectric interlayer 417. The funnel-shaped blind hole $H_2$ is filled with the dielectric material 413, the bottom electrode 415a, the dielectric interlayer 417, and the top electrode 419a. The patterned inter-layer dielectric 423 covers the capacitor 421. The contact elements 427a, 427b and 427c are embedded in the patterned inter-layer dielectric 423 and respectively contact the doped region 403, the bottom electrode 415a, and the top electrode 419a. More specifically, the patterned inter-layer dielectric 423 has the contact windows 425a, 425b and 425c to expose a portion of the doped region 403, a portion of the bottom electrode 415a, and a portion of the top electrode 419a, and the contact elements 427a, 427b and 427c are respectively disposed in the contact windows 425a, 425b and 425c. The metal lines 429 are disposed on the patterned inter-layer dielectric 423 and respectively contact the contact elements 427a, 427b and 427c. The contact elements 427a, 427b and 427c are acted as electrical connections between the metal lines 429 and the doped region 403, the bottom electrode 415a and the top electrode 419a.

Still referring to FIG. 4G, as previously described, in some embodiments, the dielectric material 413, the first conductive layer 415, the dielectric interlayer 417, and the second conductive layer 419 are referred as a filler. Moreover, the bottom electrode 415a is formed by patterning the first conductive layer 415, and the top electrode 419a is formed by patterning the second conductive layer 419. Therefore, alternatively, the semiconductor structure 400 includes a filler $F_2$ disposed in the top hole $H_{21a}$ and the bottom hole $H_{22}$. The filler $F_2$ includes a top portion $T_2$ (i.e., the portion of the dielectric material 413, the bottom electrode 415a, the dielectric interlayer 417, and the top electrode 419a filled in the top hole $H_{21a}$) and a bottom portion $B_2$ (i.e., the portion of the dielectric material 413, the bottom electrode 415a, the dielectric interlayer 417, and the top electrode 419a filled in the bottom hole $H_{22}$) in contact with the top portion $T_2$. As shown in FIG. 4G, the top portion $T_2$ has a convex side surface 431 extending from a top of the top portion $T_2$ to a top of the bottom portion $B_2$, and has the first top width $w_{21}$ greater than the second top width $w_{22}$ of the bottom portion $B_2$.

Figure 5:
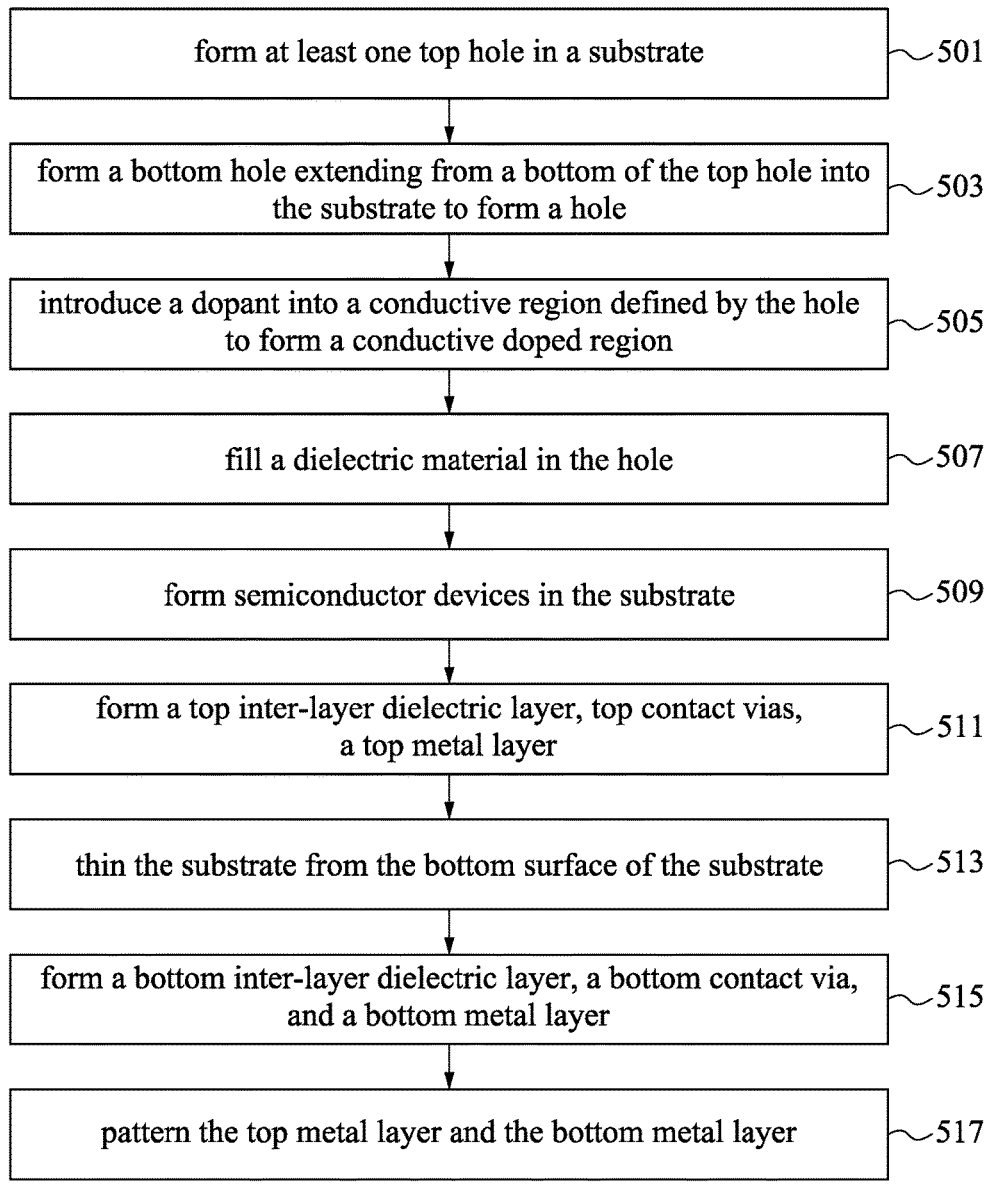
FIG. 5 is a flowchart of a method of fabricating a semiconductor structure in accordance with some embodiments of the instant disclosure.

FIG. 5 is a flowchart of a method 500 of fabricating a semiconductor structure in accordance with some exemplary embodiments of the instant disclosure. Operation 501 of the method is forming at least one top hole in a substrate. The method continues with operation 503 in which a bottom hole extending from a bottom of the top hole into the substrate is formed to form a hole. Operation 505, a dopant is introduced into a conductive region defined by the hole to form a conductive doped region. The method continues with operation 507 in which a dielectric material is filled in the hole. The method continues with operation 509 in which semiconductor devices are formed in the substrate. The method continues with operation 511 in which a top inter-layer dielectric (ILD) layer, top contact vias, a top metal layer are formed. Operation 513, the substrate is thinned from the bottom surface of the substrate. The method continues with operation 515 in which a bottom ILD layer, a bottom contact via, and a bottom metal layer are formed. Operation 517, the top metal layer and the bottom metal layer are patterned. It is understood that FIG. 5 has been simplified for a good understanding of the concepts of the instant disclosure. Accordingly, it should be noted that additional processes may be provided before, during, and after the methods of FIG. 5, and that some other processes may only be briefly described herein.

FIGS. 6A to 6I are cross-sectional views of a method for manufacturing a semiconductor structure 600 at various stages in accordance with some embodiments of the instant disclosure. FIG. 7 is a top view of the substrate shown in FIG. 6A.

Figure 6A:
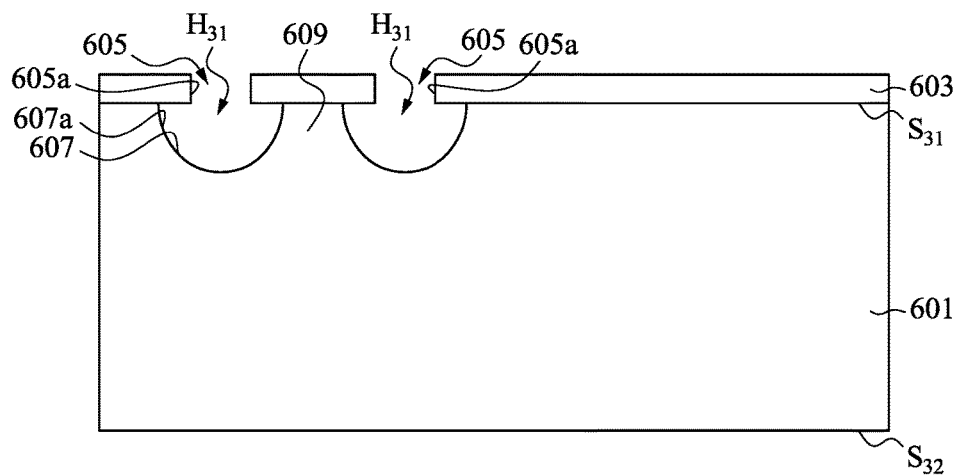
FIGS. 6A to 6I are cross-sectional views of a method for manufacturing a semiconductor structure at various stages in accordance with some embodiments of the instant disclosure.
Figure 7:
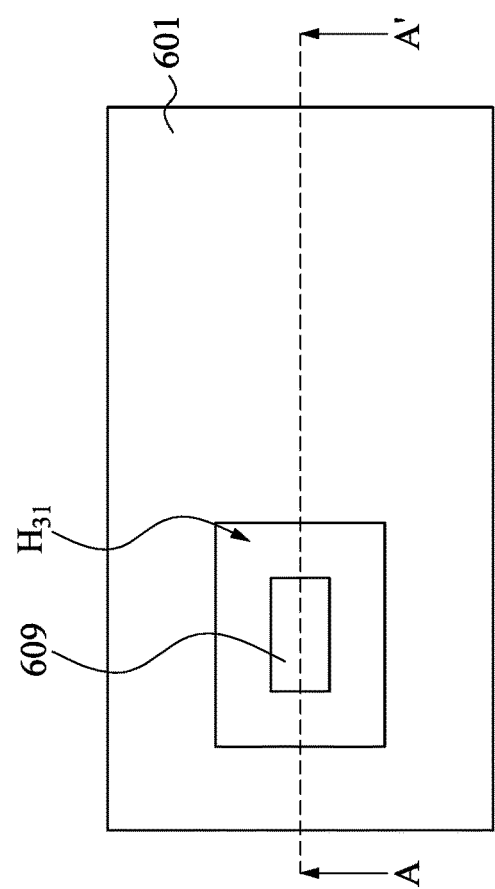
FIG. 7 is a top view of the substrate shown in FIG. 6A.

Reference is made to FIGS. 6A and 7. At least one top hole $H_{31}$ is formed in a substrate 601 (operation 501 of FIG. 5). The top hole $H_{31}$ is a ring hole. The substrate 601 shown in FIG. 6A is a cross-sectional view of FIG. 7 along the line AA'. As shown in FIG. 6A, the top hole $H_{31}$ has two cross sections. As shown in FIG. 7, the top hole $H_{31}$ is rectangular ring-shaped. However, it is noted that the scope of this application is not limited thereto. In some other embodiments, the top hole $H_{31}$ is circular ring-shaped, polygonal ring-shaped, or irregular ring-shaped.

In some embodiments, the substrate 601 is a wafer substrate. The wafer substrate may be a silicon wafer, silicon-germanium wafer, germanium wafer, or gallium-arsenide wafer. The substrate 601 may be a lightly doped (P− or N−), moderately doped (P or N), highly doped (P+ or N+), or heavily doped (P++ or N++) wafer.

Still referring to FIG. 6A, a patterned mask layer 603 which has an opening 605 is formed on the substrate 601. An etching process, e.g., an isotropic etching process, by using the patterned mask layer 603 as an etch mask, can remove a portion of the substrate 601 to form the top hole $H_{31}$. The top hole $H_{31}$ is a blind hole. In some embodiments, the isotropic etching process is a wet etching process.

As shown in FIG. 6A, the top hole $H_{31}$ has a width decreases from top to bottom. In other words, the top hole $H_{31}$ tapers from the top surface $S_{31}$ of the substrate 601 toward the bottom surface $S_{32}$ of the substrate 601. In some embodiments, the top hole $H_{31}$ is formed by etching the substrate 601 through the opening 605 by an isotropic etching process. Accordingly, the top hole $H_{31}$ is concave. Both of the two cross sections of the top hole $H_{31}$ are similar to a cross section of a bowl, as shown in FIG. 6A. An inner surface 607 of the top hole $H_{31}$ is concave, and a side surface 607a of the inner surface 607 of the top hole $H_{31}$ is also concave. It is noted that the scope of this application is not limited thereto. The shape of the top hole $H_{31}$ can be adjusted by using another etching process. In some other embodiments, both of the two cross sections of the top hole $H_{31}$ are substantially inverted trapezoidal, and the side surface of the top hole $H_{31}$ is substantially straight. In still some other embodiments, the top hole $H_{31}$ has a convex side surface.

Please refer to FIGS. 6A and 7 again. A conductive region 609 defined by the top hole $H_{31}$ is in the substrate 601. As shown in FIG. 7, the conductive region 609 is surrounded by the top hole $H_{31}$. Because the top hole $H_{31}$ shown in FIG. 7 is rectangular ring-shaped, the conductive region 609 is rectangular in the top view. However, it is noted that the scope of this application is not limited thereto. In some other embodiments, the shape of the conductive region 609 is circular, polygonal, or irregular in the top view.

Figure 6B:
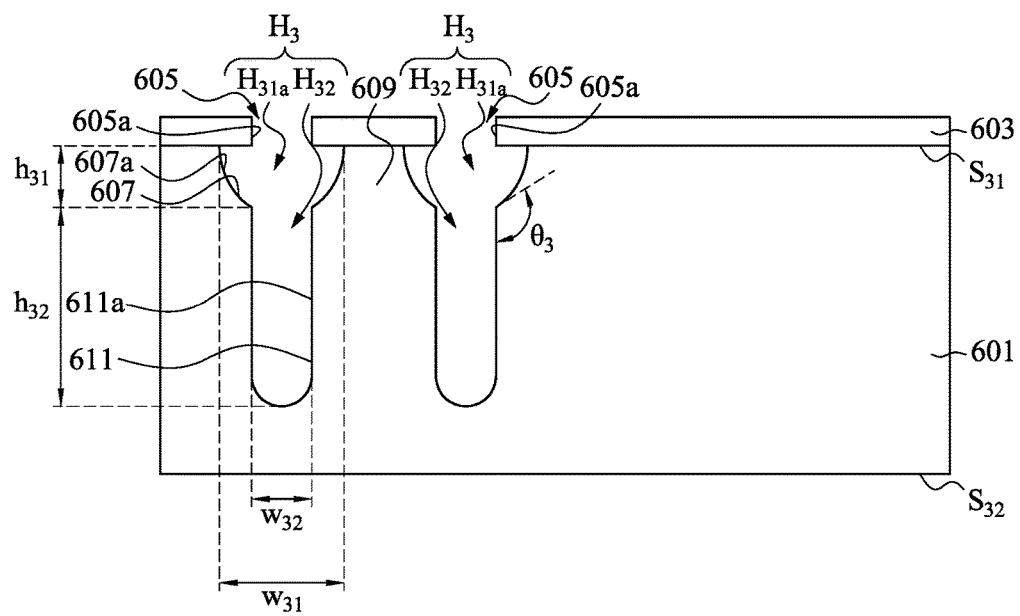

Reference is made to FIG. 6B. A bottom hole $H_{32}$ extending from a bottom of the top hole $H_{31}$ into the substrate 601 is formed to form a hole $H_3$ (the operation 503 of FIG. 5). In other words, forming the bottom hole $H_{32}$ stops before the bottom hole $H_{32}$ penetrates through the substrate 601. The bottom hole $H_{32}$ is a ring hole. The top hole $H_{31}$ in communication with the bottom hole $H_{32}$ is referred to as a top hole $H_{31a}$. Because both the top hole $H_{31a}$ and the bottom hole $H_{32}$ are ring-shaped, the hole $H_3$ is also a ring hole. Two cross sections of the hole $H_3$ are shown in FIG. 6B. An etching process, e.g., an anisotropic etching process, by using the patterned mask layer 603 as an etch mask, can remove a portion of the substrate 601 to form the bottom hole $H_{32}$. In some embodiments, the anisotropic etching process is dry etching process, e.g., DRIE. For example, DRIE is Bosch etching or cryogenic etching. After forming the hole $H_3$, the patterned mask layer 603 is removed.

In some embodiments, the bottom hole $H_{32}$ is formed by etching the substrate 601 through the opening 605 by an anisotropic etching process. Accordingly, a side surface 611a of an inner surface 611 of the bottom hole $H_{32}$ is substantially straight. In some embodiments, the side surface 611a of the bottom hole $H_{32}$ substantially aligns with a side surface 605a of the opening 605 of the patterned mask layer 603. It is noted that the side surface 607a of the top hole $H_{31a}$ and the side surface 611a of the bottom hole $H_{32}$ form an obtuse angle $\theta_3$ as shown in FIG. 6B.

Still referring to FIG. 6B, the top hole $H_{31a}$ has a first top width $w_{31}$ and a first height $h_{31}$. In some embodiments, the ratio of the first height $h_{31}$ to the first top width $w_{31}$ is about 0.5 to about 2. In some embodiments, the first top width $w_{31}$ ranges from about 0.2 to about 15 μm. In some embodiments, the first height $h_{31}$ ranges from about 0.1 to about 10 μm. The bottom hole $H_{32}$ has a second top width $w_{32}$ and a second height $h_{32}$. The second height $h_{32}$ is greater than the first height $h_{31}$. In some embodiments, the ratio of the second height $h_{32}$ to the second top width $w_{32}$ is about 1 to about 20. In some embodiments, the second top width $w_{32}$ ranges from about 0.1 to about 10 μm. In some embodiments, the second height $h_{32}$ ranges from about 1 to about 200 μm.

As shown in FIG. 6B, the first top width $w_{31}$ of the top hole $H_{31a}$ is greater than the second top width $w_{32}$ of the bottom hole $H_{32}$, and thus the upper portion (i.e., the top hole $H_{31a}$) of the hole $H_3$ is wider than the lower portion (i.e., the bottom hole $H_{32}$) of the hole $H_3$. Such shape of the hole $H_3$ is good for filling material, such as conductive material and dielectric material, into the hole $H_3$ without causing seams or voids in the material. During the filling process, the material can be deposited on the inner surface of the hole $H_3$ to fill the hole $H_3$, such that the material filled in the hole $H_3$ has a smooth and planar top surface.

Figure 6C:
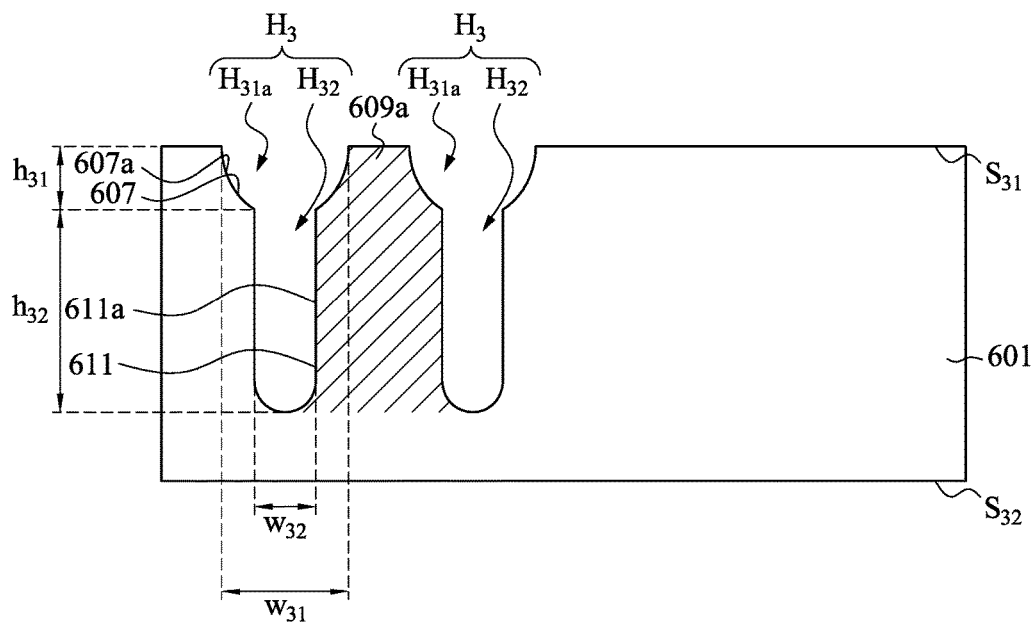

Reference is made to FIG. 6C. A dopant is introduced into the conductive region 609 defined by the hole $H_3$ to form a conductive doped region 609a (operation 505 of FIG. 5). The dopant, depending on which type the substrate 601 is, may be phosphorus, arsenic, boron, aluminum, gallium, or combinations thereof. The dopant may be doped by ion implanting or diffusion.

Figure 6D:
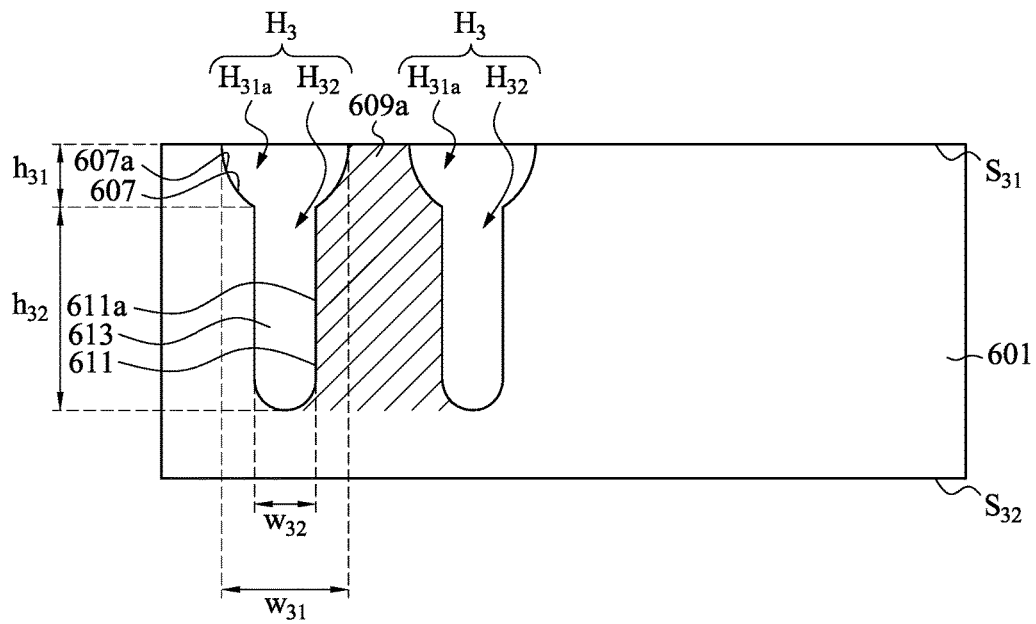

Attention is now invited to FIG. 6D. A dielectric material 613 is filled in the hole $H_3$ (operation 507 of FIG. 5). In some embodiments, the dielectric material 613 is referred to as a filler. Accordingly, the operation 507 also can be regarded as forming a filler in the top hole $H_{31a}$ and the bottom hole $H_{32}$. More specifically, the dielectric material 613 is conformally disposed in the top hole $H_{31a}$ and the bottom hole $H_{32}$ and in contact with the inner surface 607 of the top hole $H_{31a}$ and the inner surface 611 of the bottom hole $H_{32}$. Because the hole $H_3$ is ring-shaped, the dielectric material 613 disposed in the hole $H_3$ is a ring in shape. Because the top hole $H_{31a}$ is wider than the bottom hole $h_{32}$, the hole $H_3$ can be filled with the dielectric material 613. Moreover, there can be no seam or void in the dielectric material 613, and the dielectric material 613 has a substantially planar top surface. In other words, the dielectric material 613 can be seam-free and void-free.

The dielectric material 613 may include an oxide or nitride material. The dielectric material 613 is formed by deposition methods including thermal oxidation, low-pressure chemical vapor deposition (LPCVD), atmospheric-pressure chemical vapor deposition (APCVD), plasma-enhanced chemical vapor deposition (PECVD) and future-developed deposition procedures. In some embodiments, the deposition process includes a chemical mechanical polishing (CMP) process to remove the dielectric material 613 on the top surface $S_{31}$ of the substrate 601.

Figure 6E:
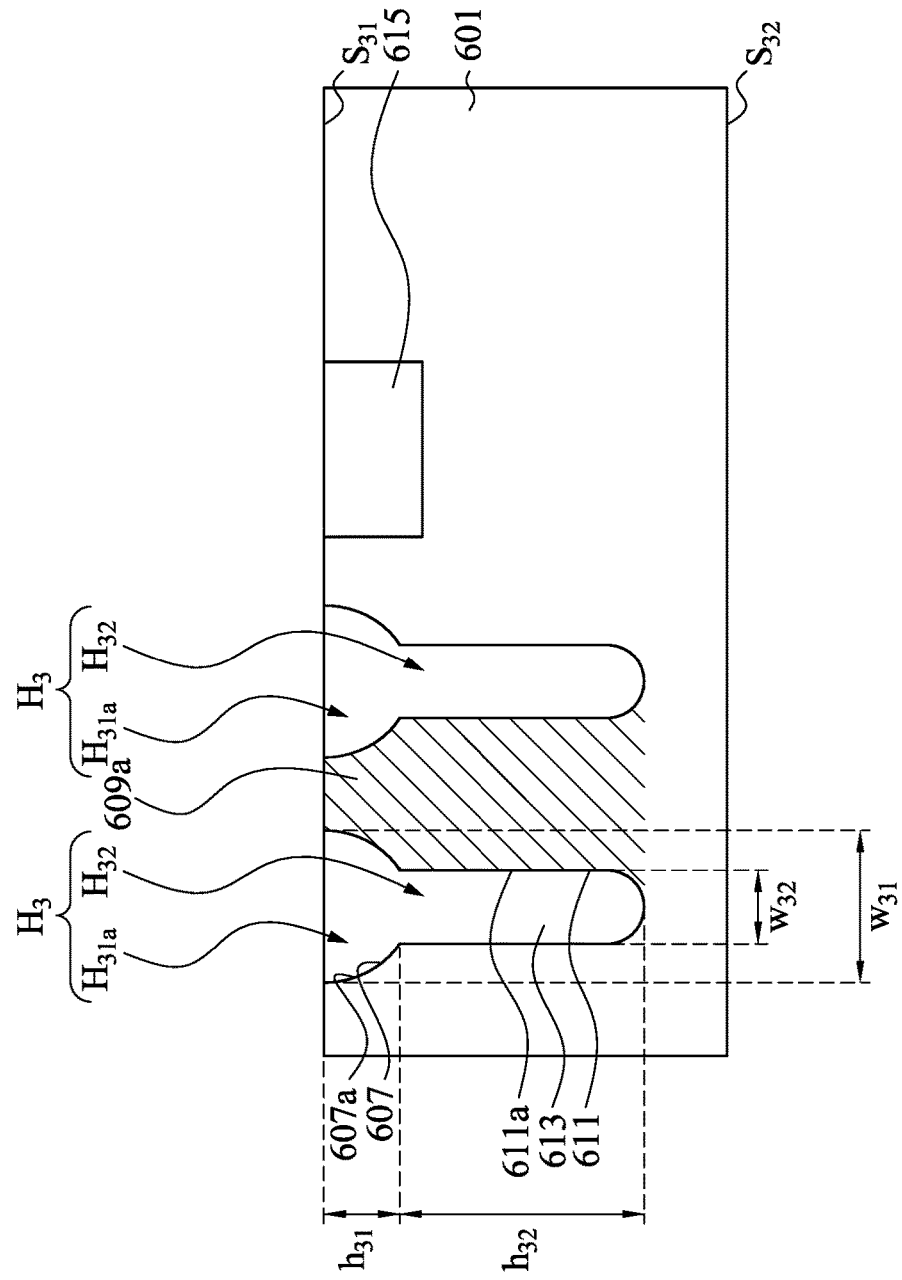

Please refer to FIG. 6E. Semiconductor devices 615 are formed in the substrate 601 (operation 509 of FIG. 5). Because the dielectric material 613 and conductive doped region 609a are formed before forming the semiconductor devices 615, the method of fabricating the semiconductor structure in the instant disclosure is a front-end-of-line (FEOL) process. The semiconductor devices 615 may include transistors, capacitors, resistors, or combinations thereof. The semiconductor devices 615, for example, are complementary metal-oxide semiconductors (CMOS). The operation of forming the semiconductor devices may include depositing, patterning, etching, doping, and any other operation known in the art.

Figure 6F:
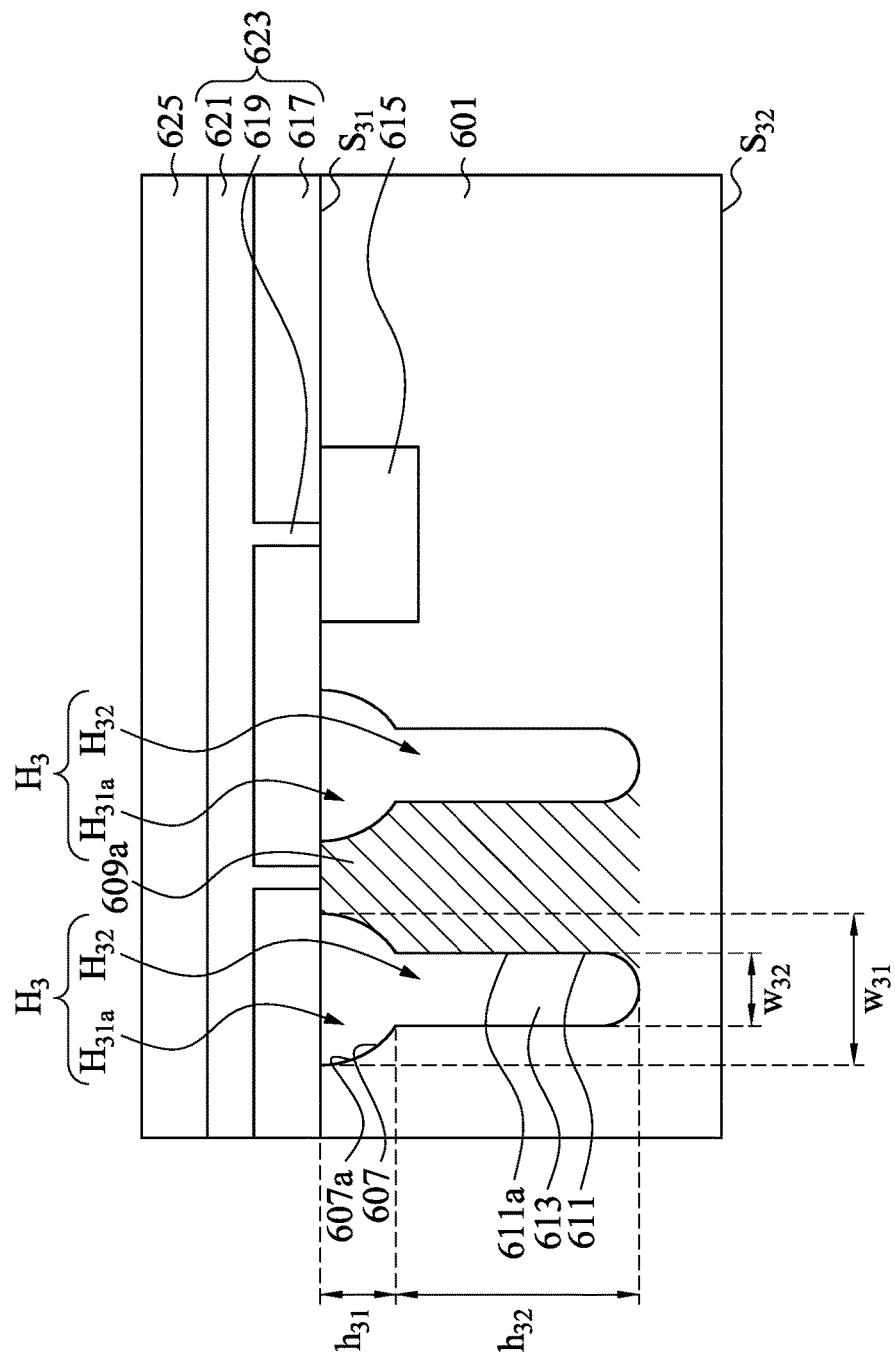

Turning now to FIG. 6F, a top inter-layer dielectric (ILD) layer 617, top contact vias 619, and a top metal layer 621 are formed (the operation 511 of FIG. 5). In other words, an interconnection structure 623 including the top ILD layer 617, the top contact vias 619, and the top metal layer 621 is formed. Because the operation 511 is performed after forming the semiconductor devices 615, the operation 511 and the subsequent operations are back end of line (BEOL) process.

Still referring to FIG. 6F, the top ILD layer 617 is formed over the top surface $S_{31}$ of the substrate 601; the top contact vias 619 are formed in the top ILD layer 617; and the top metal layer 621 is formed over the top ILD layer 617. The top ILD layer 617 may include a low-K dielectric material, such as phosphosilicate glass (PSG), borophosphosilicate glass (BPSG), fluorinated silicate glass (FSG), $SiO_xC_y$, spin-on-glass, spin-on-polymers, silicon carbon material, silicon oxide, silicon nitride, and combinations thereof. The top ILD layer 617 is formed by suitable method known in the art, such as spinning, CVD, PECVD, or LPCVD. The top contact vias 619 and the top metal layer 621 are electrically connected to the conductive doped region 609a and the semiconductor devices 615. In some embodiments, the top contact vias 619 and the top metal layer 621 are formed by etching part of the top ILD layer 617 and depositing a copper-based or aluminum-based material. For example, the copper-based material include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In some embodiments, a protection layer 625 is formed over the top metal layer 621 for protecting the interconnection structure 623. The protection layer 625 may include silicon oxide and silicon nitride and is formed by deposition method such as CVD, PVD, or sputtering.

Figure 6G:
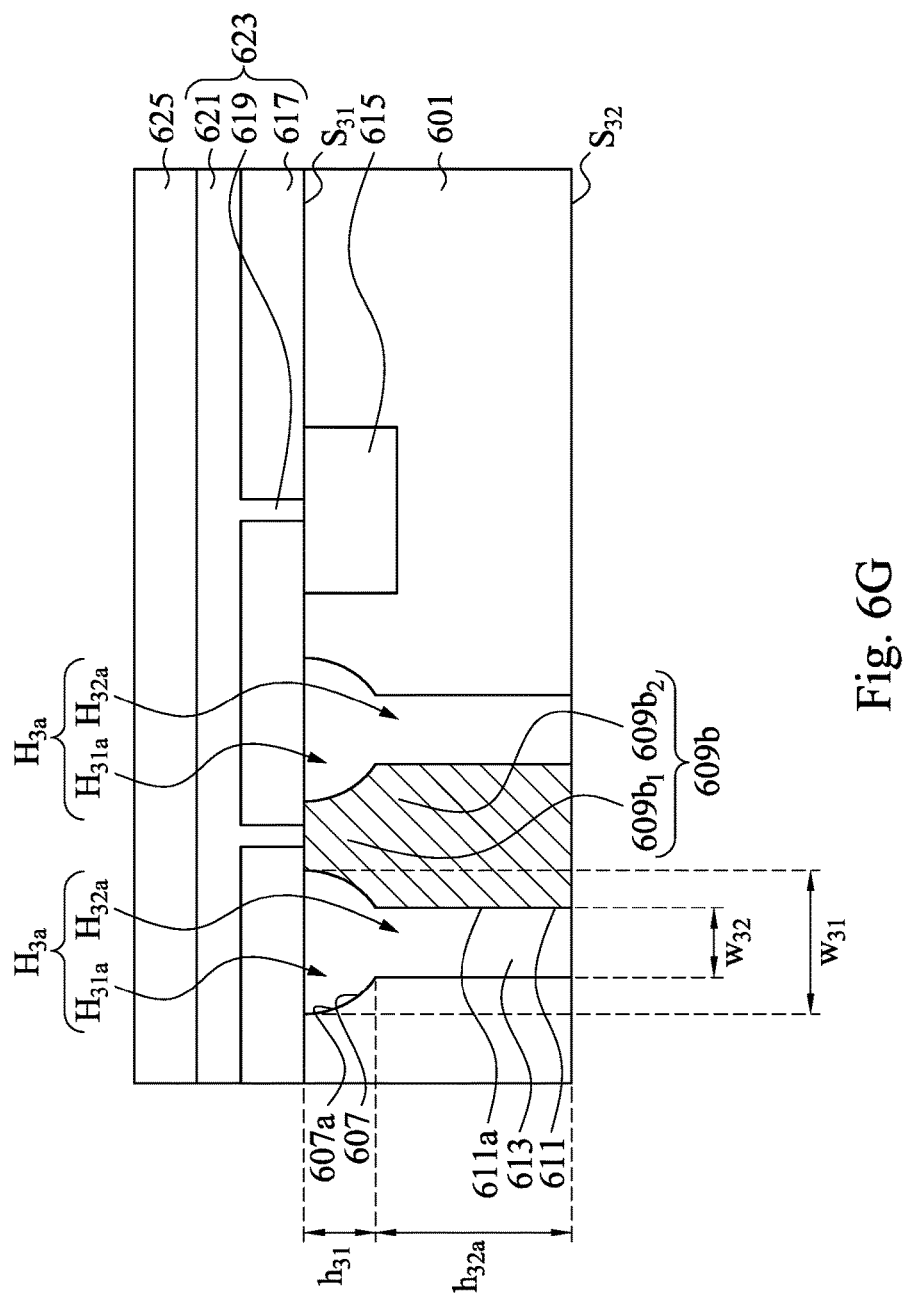

Attention is now invited to FIG. 6G. The substrate 601 is thinned from the bottom surface $S_{32}$ of the substrate 601 (the operation 513 of FIG. 5). Accordingly, the dielectric material 613 is exposed and a conductive pillar 609b is formed. The substrate 601 may be thinned by a grinding, etching, and/or polishing process to isolate the conductive doped region 609a to form the conductive pillar 609b. The conductive pillar 609b is surrounded by the dielectric material 613, which is filled in the hole $H_3$, and is isolated to the substrate 601. The conductive pillar 609b has a top portion 609$b_1$ and a bottom portion 609$b_2$, and the top portion 609$b_1$ of the conductive pillar 609b gets wider toward the bottom portion 609$b_2$ of the conductive pillar 609b. It is noted that after operation 513, the shape of the bottom hole $H_{32}$ is changed, and the shape of the hole $H_3$ is changed accordingly. The changed bottom hole $H_{32}$ is referred to as a bottom hole $H_{32a}$ which has a second height $h_{32a}$ shorter than the second height $h_{32}$ of the bottom hole $H_{32}$. The changed hole $H_3$ is referred to as a hole $H_{3a}$.

Figure 6H:
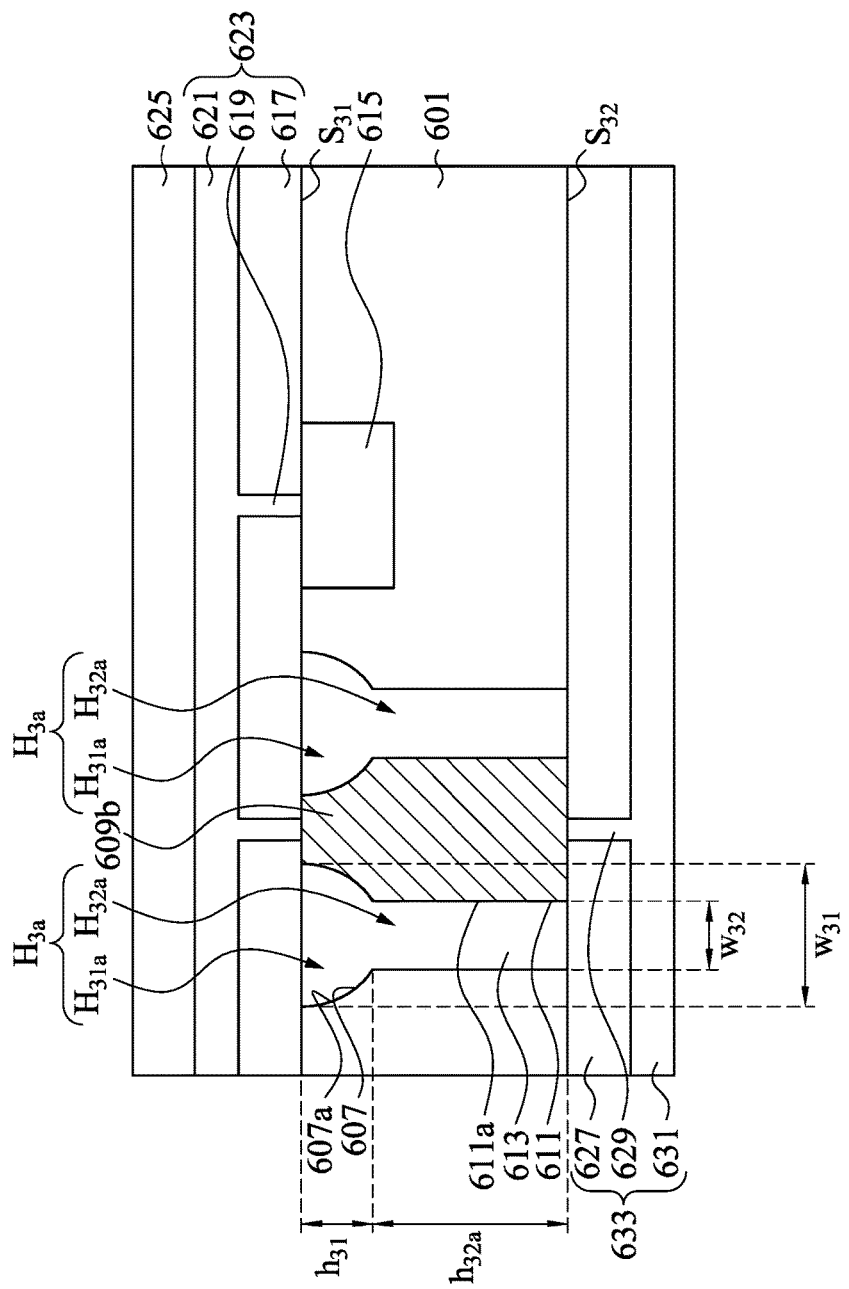

Please refer to FIG. 6H. A bottom ILD layer 627, a bottom contact via 629, and a bottom metal layer 631 are formed (the operation 515 of FIG. 5). In other words, an interconnection structure 633 including the bottom ILD layer 627, the bottom contact via 629, and the bottom metal layer 631 is formed. The bottom ILD layer 627 is formed over the bottom surface $S_{32}$ of the substrate 601; the bottom contact via 629 is formed in the bottom ILD layer 627; the bottom metal layer 631 covers the bottom ILD layer 627. The bottom ILD layer 627 may include the same material with the top ILD layer 617, for example, silicon oxide or BPSG. The bottom ILD layer 627 may be formed by suitable method known in the art, such as spinning, PVD, CVD, PECVD, or LPCVD. The bottom contact via 629 and the bottom metal layer 631 are electrically connected to the conductive pillar 609b. The bottom contact via 629 and the bottom metal layer 631 are formed by etching part of the bottom ILD layer 627 and depositing a conductive material, such as the copper-based material or aluminum-based material.

Figure 6I:
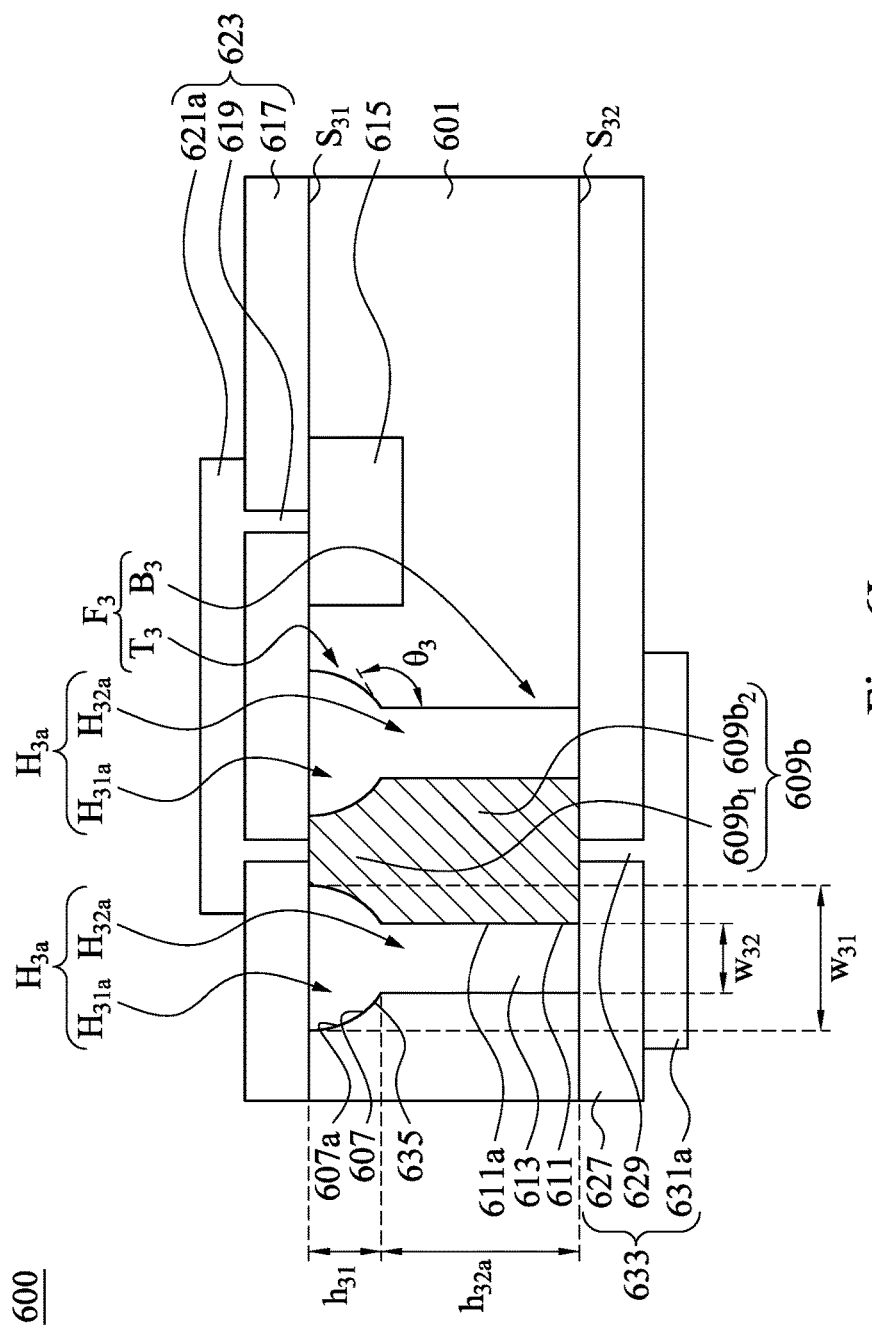

Please refer to FIG. 6I. The top metal layer 621 and the bottom metal layer 631 are patterned to form a top metal layer 621a and bottom metal layer 631a (the operation 517 of FIG. 5). Accordingly, the semiconductor structure 600 is formed.

As shown in FIG. 6I, the semiconductor structure 600 includes the substrate 601, the conductive pillar 609b, the dielectric material 613, the semiconductor devices 615, the interconnection structure 623, and the interconnection structure 633. The interconnection structure 623 includes the top ILD layer 617, the top contact vias 619, and the top metal layer 621a. The interconnection structure 633 includes the bottom ILD layer 627, the bottom contact via 629, and the bottom metal layer 631a. The substrate 601 has the top surface $S_{31}$ and the bottom surface $S_{32}$, and has the hole $H_{3a}$ therein. The hole $H_{3a}$ is a ring hole, and extends through the substrate 601 between the top surface $S_{31}$ and the bottom surface $S_{32}$. The hole $H_{3a}$ has two cross sections as shown in FIG. 6I. The two cross sections are funnel-shaped. The hole $H_{3a}$ has the top hole $H_{31a}$ and the bottom hole $H_{32a}$ under the top hole $H_{31a}$. The top hole $H_{31a}$ and the bottom hole $H_{32a}$ are in communication with each other. The side surface 607a of the top hole $H_{31a}$ and the side surface 611a of the bottom hole $H_{32a}$ form the obtuse angle $\theta_3$. The top hole $H_{31a}$ has the first top width $w_{31}$ greater than the second top width $w_{32}$ of the bottom hole $H_{32a}$. Moreover, the top hole $H_{31a}$ tapers from the top surface $S_{31}$ toward the bottom hole $H_{32a}$ (or the bottom surface $S_{32}$). In some embodiments, the side surface 607a of the top hole $H_{31a}$ is curved. In FIG. 6I, the side surface 607a of the top hole $H_{31a}$ is concave. In some other embodiments, the side surface of the top hole $H_{31a}$ is convex or substantially straight. The dielectric material 613 is conformally disposed and filled in the top hole $H_{31a}$ and the bottom hole $H_{32a}$, and in contact with the inner surface 607 of the top hole $H_{31a}$ and the inner surface 611 of the bottom hole $H_{32a}$. Because the hole $H_{3a}$ is ring-shaped, the dielectric material 613 disposed in the hole $H_3$ is a ring in shape. Accordingly, the conductive pillar 609b is surrounded by the dielectric material 613. The conductive pillar 609b is in the substrate 601, and has the top portion 609$b_1$ and the bottom portion 609$b_2$. The top portion 609$b_1$ of the conductive pillar 609b gets wider toward the bottom portion 609$b_2$ of the conductive pillar 609b. It is noted that both the dielectric material 613 and the conductive pillar 609b penetrates through the substrate 601. The interconnection structure 623 is disposed on the top surface $S_{31}$ of the substrate 601. More specifically, the top ILD layer 617 and the top contact vias 619 are disposed on the top surface $S_{31}$. The top contact vias 619 are in contact with the conductive pillar 609b and the semiconductor devices 615. The top metal layer 621a is in contact with the top contact vias 619. The interconnection structure 633 is disposed on the bottom surface $S_{32}$ of the substrate 601. More specifically, the bottom ILD layer 627 and the bottom contact via 629 are disposed on the bottom surface $S_{32}$. The bottom contact via 629 is in contact with the conductive pillar 609b. The bottom metal layer 631a is in contact with the bottom contact via 629. The top contact vias 619 and the top metal layer 621a are electrically connected to the bottom contact via 629 and the bottom metal layer 631a through the conductive pillar 609b.

Still referring to FIG. 6I, as previously described, in some embodiments, the dielectric material 613 is referred to as a filler. Therefore, alternatively, the semiconductor structure 600 includes a filler $F_3$ disposed in the top hole $H_{31a}$ and the bottom hole $H_{32a}$. The filler $F_3$ includes a top portion $T_3$ (i.e., the portion of the dielectric material 613 filled in the top hole $H_{11a}$) and a bottom portion $B_3$ (i.e., the portion of the dielectric material 613 filled in the bottom hole $H_{12a}$) in contact with the top portion $T_3$. As shown in FIG. 6I, the top portion $T_3$ has a convex side surface 635 extending from a top of the top portion $T_3$ to a top of the bottom portion $B_3$, and has the first top width $w_{31}$ greater than the second top width $w_{32}$ of the bottom portion $B_3$.

Figure 8:
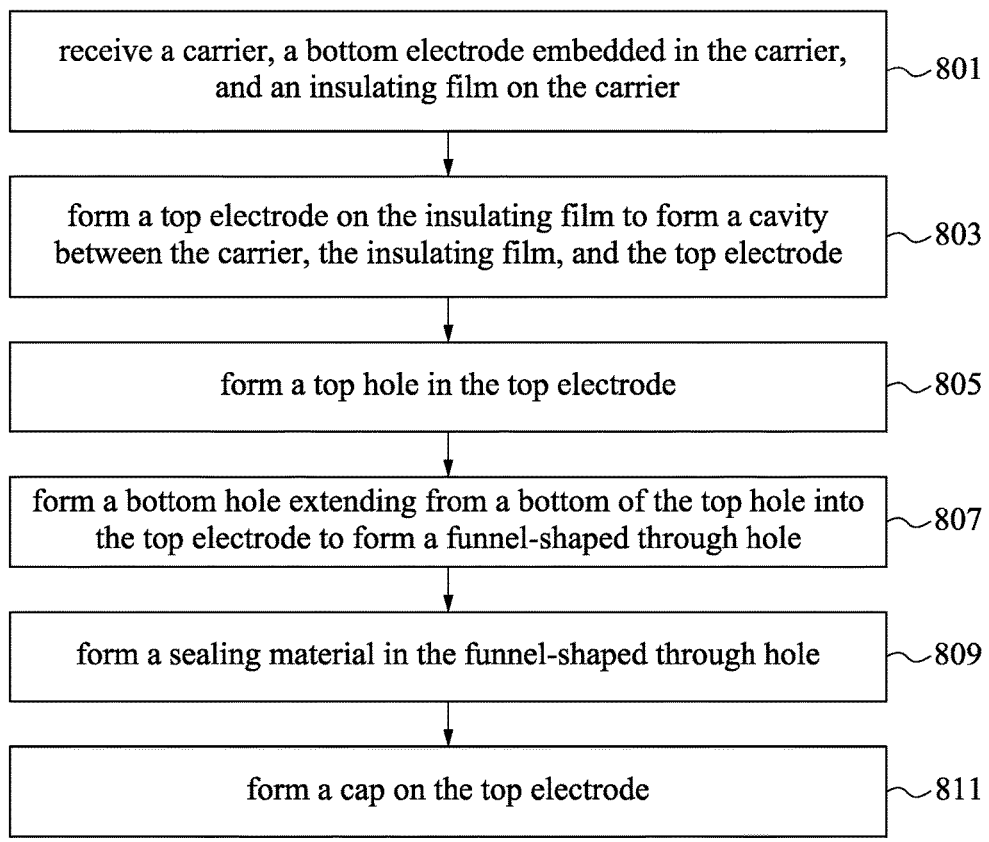
FIG. 8 is a flowchart of a method of fabricating a semiconductor structure in accordance with some embodiments of the instant disclosure.

FIG. 8 is a flowchart of a method 800 of fabricating a semiconductor structure in accordance with some embodiments of the instant disclosure. Operation 801 of the method is receiving a carrier, a bottom electrode embedded in the carrier, and an insulating film on the carrier. The method continues with operation 803 in which a top electrode is formed on the insulating film to form a cavity between the carrier, the insulating film, and the top electrode. Operation 805, a top hole is formed in the top electrode. The method continues with operation 807 in which a bottom hole extending from a bottom of the top hole into the top electrode is formed to form a funnel-shaped through hole. The method continues with operation 809 in which a sealing material is formed in the funnel-shaped through hole. The method continues with operation 811 in which a cap is formed on the top electrode. It is understood that FIG. 8 has been simplified for a good understanding of the concepts of the instant disclosure. Accordingly, it should be noted that additional processes may be provided before, during, and after the methods of FIG. 8, and that some other processes may only be briefly described herein.

FIGS. 9A to 9F are cross-sectional views of a method for manufacturing a semiconductor structure 900 at various stages in accordance with some embodiments of the instant disclosure.

Reference is made to FIG. 9A. A carrier 901, a bottom electrode 903 embedded in the carrier 901, and an insulating film 905 on the carrier 901 are received (the operation 801 of FIG. 8). The carrier 901 has a recess 907, which is surrounded by the insulating film 905. In some embodiments, the carrier 901 is a semiconductor substrate. Examples of semiconductors include silicon, silicon on insulator (SOI), Ge, SiC, GaAs, GaAlAs, InP, and GaNSiGe. The carrier 901 may be doped of either n-type or p-type, or undoped. In some embodiments, metal oxide semiconductor field effect transistors (MOSFETs) are added to the carrier 901. These can be of the n-type, the p-type or both types in a complementary metal oxide semiconductor (CMOS) process. In some embodiments, a CMOS device is embedded in the carrier 901. The bottom electrode 903 may be electrically connected with the CMOS device. In some other embodiments, a portion of the CMOS device is the bottom electrode 903.

Reference is made to FIG. 9B. A top electrode 909 is formed on the insulating film 905 to form a cavity 911 between the carrier 901, the insulating film 905, and the top electrode 909 (operation 803 of FIG. 8). In some embodiments, the top electrode 909 is referred to as a substrate, and the substrate is conductive. The cavity 911 is isolated from the surroundings. That is, the cavity 911 is enclosed. Moreover, the top electrode 909 is isolated from the bottom electrode 903 by the carrier 901 and the insulating film 905. Accordingly, the carrier 901, the bottom electrode 903, the insulating film 905, and the top electrode 909 form a capacitor CP. The capacitance between the top electrode 909 and the bottom electrode 903 is determined by the distance between them.

The top electrode 909 may be made of suitable conductive material. Examples of the conductive material include but not limited to polycrystalline silicon, molybdenum (Mo), aluminum (Al), titanium (Ti), tantalum (Ta), copper (Cu), tin (Sn), nickel (Ni), gold (Au), silver (Ag), tungsten (W), chromium (Cr), platinum (Pt), metal alloy, or combinations thereof. In some embodiments, the polycrystalline silicon is doped with impurities.

Figure 9C:
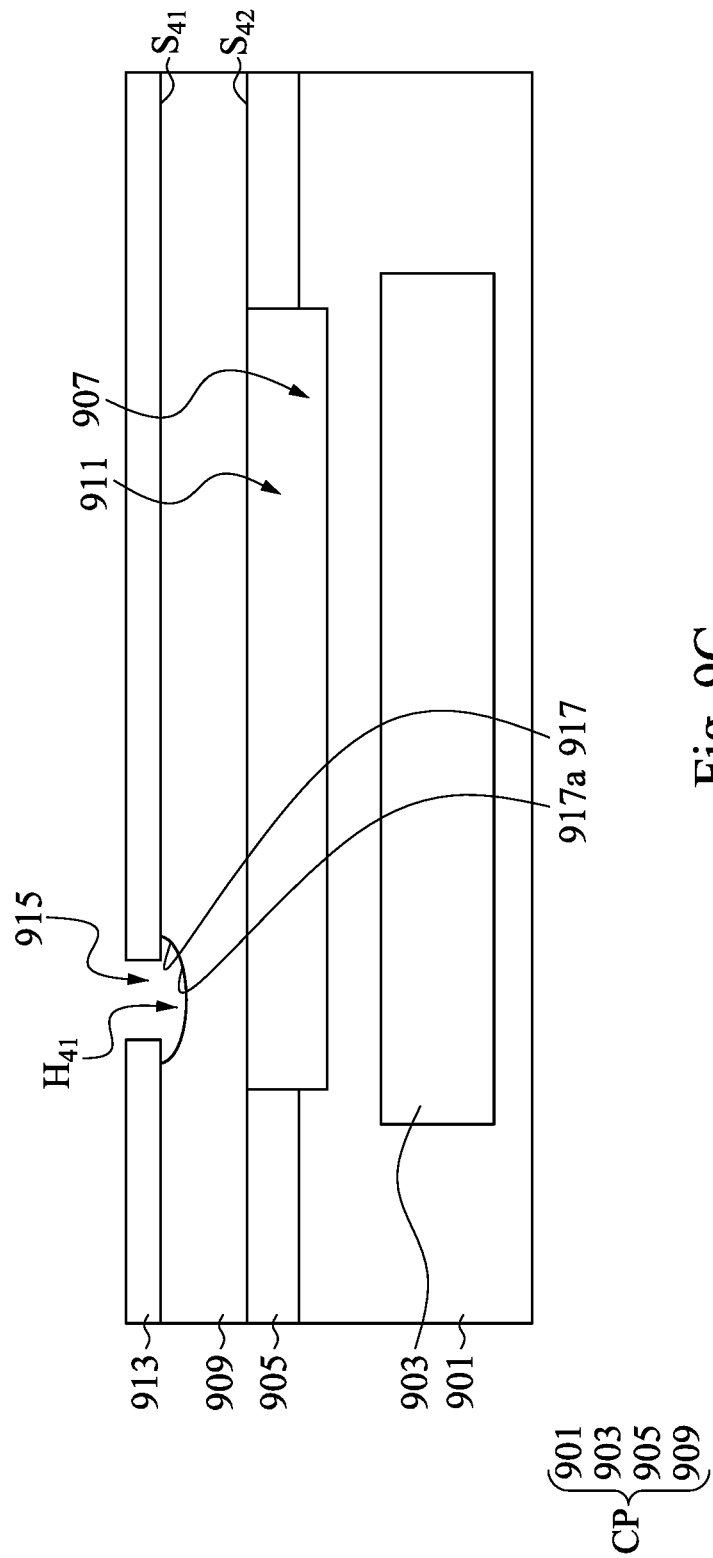

Reference is made to FIG. 9C. A top hole $H_{41}$ is formed in the top electrode 909 (the operation 805 of FIG. 8). More specifically, a patterned mask layer 913 which has an opening 915 is formed on the top electrode 909. An etching process, e.g., an isotropic etching process, by using the patterned mask layer 913 as an etch mask, can remove a portion of the top electrode 909 to form the top hole $H_{41}$. The top hole $H_{41}$ is a blind hole. In some embodiments, the isotropic etching process is a wet etching process.

The top hole $H_{41}$ has a width decreases from top to bottom. In other words, the top hole $H_{41}$ tapers from the top surface $S_{41}$ of the top electrode 909 toward the bottom surface $S_{42}$ of the top electrode 909. In some embodiments, the top hole $H_{41}$ is formed by etching the top electrode 909 through the opening 915 by an isotropic etching process. Accordingly, the top hole $H_{41}$ is substantially bowl-shaped.

In other words, the top hole $H_{41}$ is concave. Accordingly, an inner surface 917 of the top hole $H_{41}$ is concave, and a side surface 917a of the inner surface 917 of the top hole $H_{41}$ is also concave. It is noted that the scope of this application is not limited thereto. The shape of the top hole $H_{41}$ can be adjusted by using another etching process. In some other embodiments, the cross section of the top hole $H_{41}$ is substantially inverted trapezoidal, and the side surface of the top hole $H_{41}$ is substantially straight. In still some other embodiments, the top hole $H_{41}$ has a convex side surface.

Figure 9D:
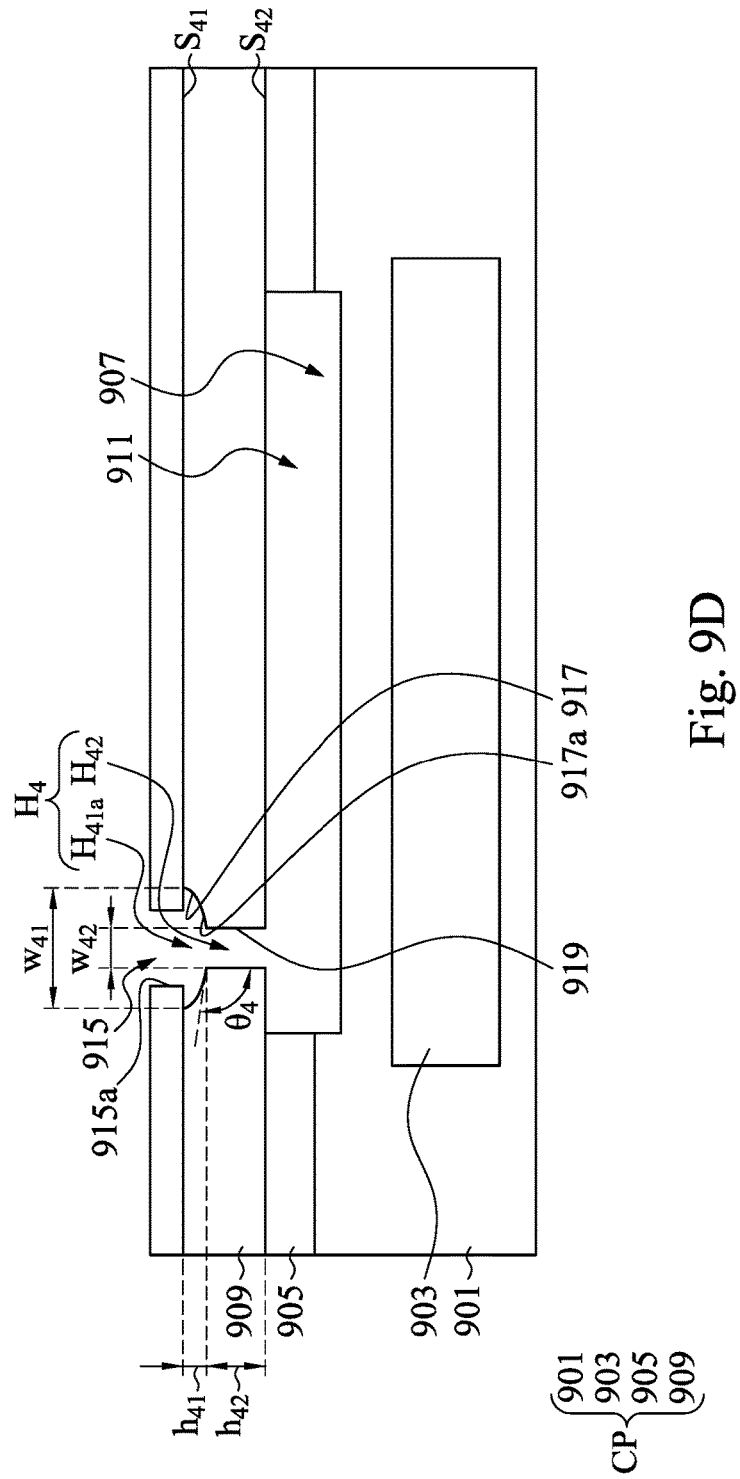

Attention is now invited to FIG. 9D. A bottom hole $H_{42}$ extending from a bottom of the top hole $H_{41}$ into the top electrode 909 is formed to form a funnel-shaped through hole $H_4$ (the operation 807 of FIG. 8). In other words, forming the bottom hole $H_{42}$ stops until the bottom hole $H_{42}$ penetrates through the top electrode 909. The top hole $H_{41}$ in communication with the bottom hole $H_{42}$ is referred to as a top hole $H_{41a}$. An etching process, e.g., an anisotropic etching process, by using the patterned mask layer 913 as an etch mask, can remove a portion of the top electrode 909 to form the bottom hole $H_{42}$. In some embodiments, the anisotropic etching process is dry etching process, e.g., deep reactive-ion etching (DRIE). For example, DRIE is Bosch etching or cryogenic etching.

In some embodiments, the bottom hole $H_{42}$ is formed by etching the top electrode 909 through the opening 915 by an anisotropic etching process. Because the anisotropic etching etches in a single direction into the surface of the top electrode 909, as shown in FIG. 9D, the bottom hole $H_{42}$ is a substantially straight hole. In some embodiments, an inner surface 919 (i.e., a side surface 919a) of the bottom hole $H_{42}$ is substantially straight. In some embodiments, the inner surface 919 (i.e., the side surface 919a) of the bottom hole $H_{42}$ substantially aligns with a side surface 915a of the opening 915 of the patterned mask layer 913. It is noted that the side surface 917a of the top hole $H_{41a}$ and the side surface 919a of the bottom hole $H_{42}$ form an obtuse angle $\theta_4$ as shown in FIG. 9D. After forming the funnel-shaped through hole $H_4$, the patterned mask layer 913 is removed.

At this stage, the cavity 911 is in communication with the surroundings via the funnel-shaped through hole $H_4$, and therefore the pressure of the cavity 911 is substantially equal to the pressure of the surroundings. In some embodiments, the funnel-shaped through hole $H_4$ is referred to as a vent hole.

Still referring to FIG. 9D, the top hole $H_{41a}$ has a first top width $w_{41}$ and a first height $h_{41}$. In some embodiments, the ratio of the first height $h_{41}$ to the first top width $w_{41}$ is about 0.5 to about 2. In some embodiments, the first top width $w_{41}$ ranges from about 0.2 to about 15 μm. In some embodiments, the first height $h_{41}$ ranges from about 0.1 to about 10 μm. The bottom hole $H_{42}$ has a second top width $w_{42}$ and a second height $h_{42}$. The second height $h_{42}$ is greater than the first height $h_{41}$. In some embodiments, the second top width $w_{42}$ ranges from about 0.1 to about 10 μm.

As shown in FIG. 9D, the first top width $w_{41}$ of the top hole $H_{41a}$ is greater than the second top width $w_{42}$ of the bottom hole $H_{42}$, and thus the upper portion (i.e., the top hole $H_{41a}$) of the funnel-shaped through hole $H_4$ is wider than the lower portion (i.e., bottom hole $H_{42}$) of the funnel-shaped through hole $H_4$. Such shape of the funnel-shaped through hole $H_4$ is good for forming sealing material, such as conductive material and dielectric material, to seal the funnel-shaped through hole $H_4$ without causing seams or voids in the sealing material. Moreover, the sealing material filled in the funnel-shaped through hole $H_4$ has a smooth and planar top surface.

Figure 9E:
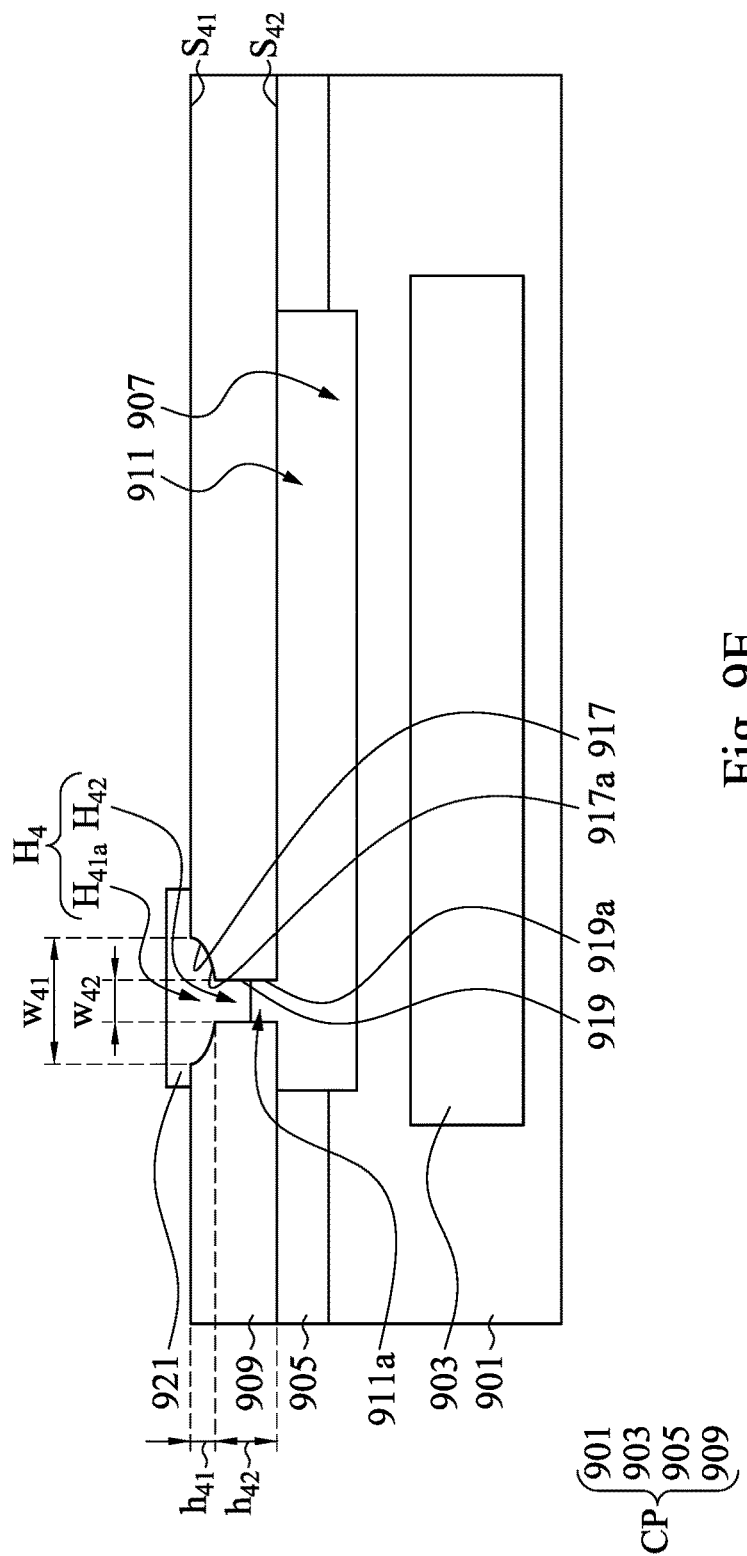

Please refer to FIG. 9E. A sealing material 921 is formed in the funnel-shaped through hole $H_4$ to seal the funnel-shaped through hole $H_4$ (the operation 809 of FIG. 8). In some embodiments, the sealing material 921 is referred to as a filler. Accordingly, the operation 809 also can be regarded as forming a filler in the top hole $H_{41a}$ and the bottom hole $H_{42}$. The sealing material 921 is conformally disposed in the top hole $H_{41a}$ and the bottom hole $H_{42}$, and in contact with the inner surface 917 of the top hole $H_{41a}$ and the inner surface 919 of the bottom hole $H_{42}$. At this stage, the cavity 911 is isolated from the surroundings again by the sealing material 921. That is, the cavity 911 is an enclosed cavity. In FIG. 9E, the sealing material 921 covers a portion of the top surface $S_{41}$ of the top electrode 909. However, it is noted that the scope of this application is not limited thereto. In some other embodiments, the sealing material 921 is disposed in the funnel-shaped through hole $H_4$ but without covering the top surface $S_{41}$. In FIG. 9E, the sealing material 921 covers the side surface 917a of the top hole $H_{41a}$ and a portion of the side surface 919a of the bottom hole $H_{42}$, and an air gap 911a is formed in the bottom hole $H_{42}$ of the funnel-shaped through hole $H_4$ and under the sealing material 921. However, it is noted that the scope of this application is not limited thereto. In some other embodiments, the funnel-shaped through hole $H_4$ is filled with the sealing material 921. In still some other embodiments, a portion of the sealing material 921 protrudes from the lower surface $S_{42}$ of the top electrode 909.

Because the top hole $H_{41a}$ is wider than the bottom hole $h_{42}$, the funnel-shaped through hole $H_4$ can be sealed with the sealing material 921. Moreover, there can be no seam or void in the sealing material 921, and the sealing material 921 has a substantially planar top surface. In other words, the sealing material 921 can be seam-free and void-free. Accordingly, the problem that the funnel-shaped through hole $H_4$ is not entirely sealed by the sealing material 921 can be avoided.

The sealing material 921 is conductive or non-conductive. Accordingly, the sealing material 921 may be made of suitable dielectric material or conductive material. Examples of the dielectric material include but not limited to silicon oxide ($SiO_2$), silicon nitride ($Si_3N_4$), silicon oxynitride ($Si_{O_xN_y}$), aluminum oxide ($Al_2O_3$), aluminum nitride (AlN), aluminum oxynitride (AlON) or a combination thereof. Examples of the conductive material include but not limited to molybdenum (Mo), aluminum (Al), titanium (Ti), tantalum (Ta), copper (Cu), tin (Sn), nickel (Ni), gold (Au), silver (Ag), tungsten (W), chromium (Cr), platinum (Pt), metal alloy, or a combination thereof.

It is noted that, before forming the sealing material 921, the pressure of the cavity 911 is same as the pressure of the surroundings. After forming the sealing material 921 to isolate the cavity 911 from the surroundings, when the pressure of the surroundings changes, the cavity 911 would expand or compress. Accordingly, the distance between the top electrode 909 and the bottom electrode 903 would be changed, and the capacitance between the top electrode 909 and the bottom electrode 903 would be changed accordingly. By measuring the capacitance, the pressure difference between the cavity 911 and the surroundings can be detected. Accordingly, the whole structure shown in FIG. 9E can be used to detect ambient pressure. In some embodiments, the whole structure shown in FIG. 9E is referred to as a capacitive pressure sensor.

Figure 9F:
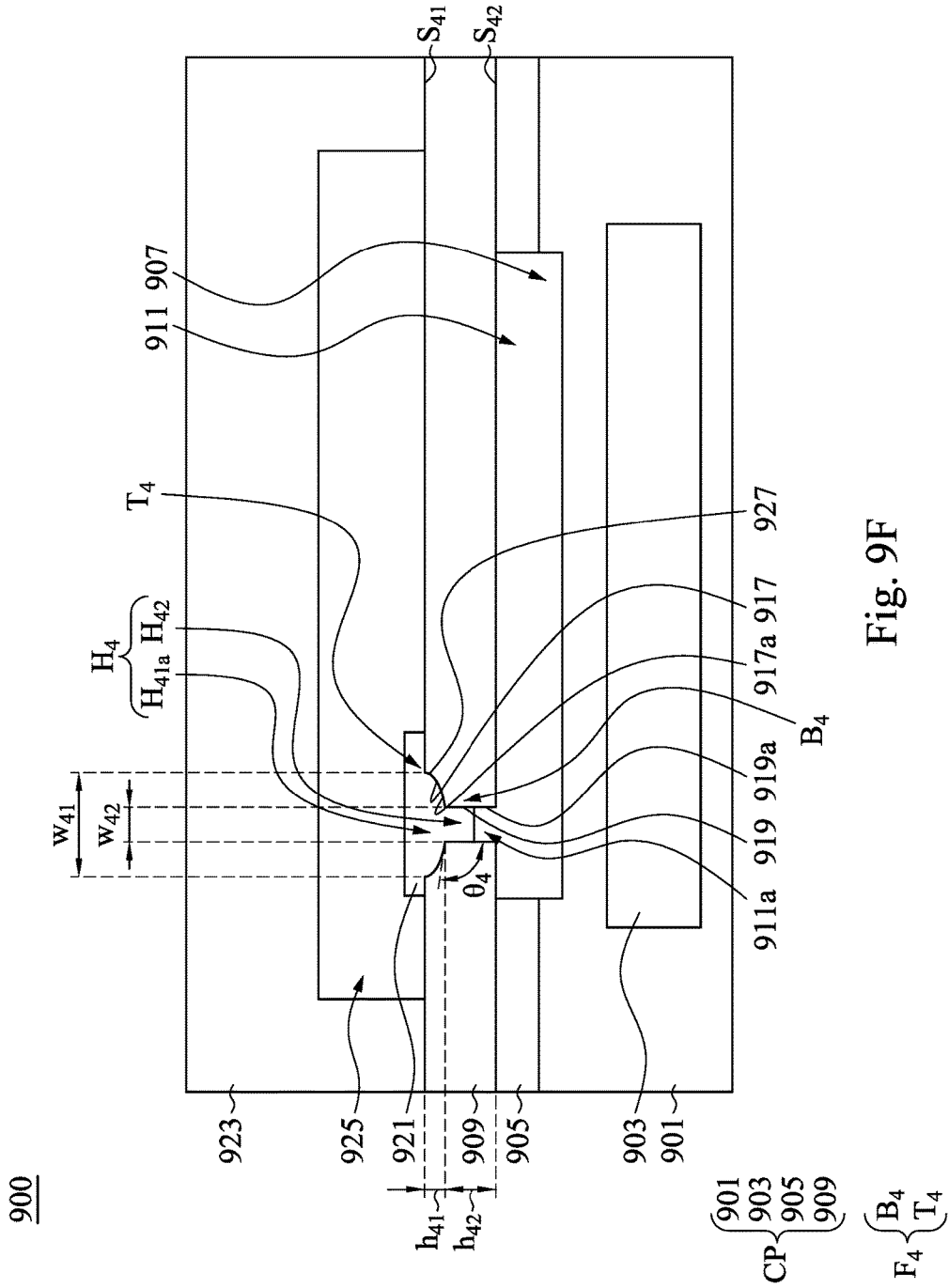

Turning now to FIG. 9F, a cap 923 is formed on the top electrode 909 for protecting the structure shown in FIG. 9E (the operation 811 of FIG. 8). The cap 110 is bonded with the top electrode 909 by using suitable processes, such as eutectic bonding, thermal compression bonding and adhesive bonding. An enclosed cavity 925 is defined by the top electrode 909, the sealing material 921, and the cap 923. Accordingly, the semiconductor structure 900 is formed.

As shown in FIG. 9F, the semiconductor structure 900 includes the capacitor CP, the sealing material 921, and the cap 923. The capacitor CP includes the carrier 901, the bottom electrode 903, the insulating film 905, and the top electrode 909. The top electrode 909 has the top surface $S_{41}$ and the bottom surface $S_{42}$, and has the funnel-shaped through hole $H_4$ therein. The funnel-shaped through hole $H_4$ extends through the top electrode 909 between the top surface $S_{41}$ and the bottom surface $S_{42}$. The funnel-shaped through hole $H_4$ has the top hole $H_{41a}$ and the bottom hole $H_{42}$ under the top hole $H_{41a}$. The top hole $H_{41a}$ and the bottom hole $H_{42}$ are in communication with each other. The side surface 917a of the top hole $H_{41a}$ and the side surface 919a of the bottom hole $H_{42}$ form the obtuse angle $\theta_4$. The top hole $H_{41a}$ has the first top width $w_{41}$ greater than the second top width $w_{42}$ of the bottom hole $H_{42}$. Moreover, the top hole $H_{41a}$ tapers from the top surface $S_{41}$ toward the bottom hole $H_{42}$ (or the bottom surface $S_{42}$). In some embodiments, the side surface 917a of the top hole $H_{41a}$ is curved. In FIG. 9F, the side surface 917a of the top hole $H_{41a}$ is concave. In some other embodiments, the side surface of the top hole $H_{41a}$ is convex or substantially straight. The sealing material 921 is conformally disposed in the top hole $H_{41a}$ and the bottom hole $H_{42}$ and in contact with the inner surface 917 of the top hole $H_{41a}$ and the inner surface 919 of the bottom hole $H_{42}$ to seal the top hole $H_{41a}$ and the bottom hole $H_{42}$. In FIG. 9F, the sealing material 921 covers the side surface 917a of the top hole $H_{41a}$ and a portion of the side surface 919a of the bottom hole $H_{42}$. However, it is noted that the scope of this application is not limited thereto. In some other embodiments, the funnel-shaped through hole $H_4$ is filled with the sealing material 921. In still some other embodiments, a portion of the sealing material 921 protrudes from the lower surface $S_{42}$ of the top electrode 909. Further, in FIG. 9F, the sealing material 921 covers the top surface $S_{41}$ of the top electrode 909. However, it is noted that the scope of this application is not limited thereto. In some other embodiments, the sealing material 921 does not cover the top surface $S_{41}$ of the top electrode 909. The carrier 901 is disposed under the top electrode 909. The lower electrode 903 is embedded in the carrier 901. The insulating film 905 is disposed between the top electrode 909 and the carrier 901, wherein the cavity 911 is defined by the carrier 901, the insulating film 905, and the top electrode 909. In some embodiments, the top electrode 909 is referred to as a substrate, and the substrate is conductive.

Still referring to FIG. 9F, as previously described, in some embodiments, the sealing material 921 is referred to as a filler. Therefore, alternatively, the semiconductor structure 900 includes a filler $F_4$ disposed in the top hole $H_{41a}$ and the bottom hole $H_{42}$. The filler $F_4$ includes a top portion $T_4$ (i.e., the portion of the sealing material 921 filled in the top hole $H_{41a}$) and a bottom portion $B_4$ (i.e., the portion of the sealing material 921 filled in the bottom hole $H_{42}$) in contact with the top portion $T_4$. As shown in FIG. 9F, the top portion $T_4$ has a convex side surface 927 extending from a top of the top portion $T_4$ to a top of the bottom portion $B_4$, and has the first top width $w_{41}$ greater than the second top width $w_{42}$ of the bottom portion $B_4$.

From the above descriptions, both the funnel-shaped blind hole and the funnel-shaped through hole are good for filling material and forming sealing material into these holes and reducing the possibility of causing seams or voids within these materials. Accordingly, during fabrication of semiconductor structures, problems caused by seams or voids can be avoided.

In some embodiments of the instant disclosure, a semiconductor structure includes a substrate, a hole which includes a top hole and a bottom hole in communication with each other in the substrate, and a filler in the top hole and the bottom hole, wherein the top hole tapers toward the bottom hole, and a side surface of the top hole and a side surface of the bottom hole form an obtuse angle.

In some embodiments of the instant disclosure, a semiconductor structure includes a substrate having a funnel-shaped hole therein, and a filler disposed in the funnel-shaped hole, wherein the filler comprises a top portion and a bottom portion in contact with the top portion, the top portion has a convex side surface extending from a top of the top portion to a top of the bottom portion, and has a first top width greater than a second top width of the bottom portion.

In some embodiments of the instant disclosure, a method of fabricating a semiconductor structure includes the following steps. A top hole extending from a top surface of a substrate into the substrate and tapering toward a bottom surface of the substrate is formed, wherein the top hole is concave. A bottom hole extending from a bottom of the top hole into the substrate is formed. A filler is formed in the top hole and the bottom hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate; and
a filler disposed in the substrate and comprising a top portion and a bottom portion, wherein the top portion tapers toward the bottom portion and a side surface of the top portion and a side surface of the bottom portion form an obtuse angle, the filler comprising:
a dielectric material conformally disposed in the top portion and the bottom portion and in contact with the side surface of the top portion and the side surface of the bottom portion;
a bottom electrode conformally disposed on the dielectric material and at least partially in the top portion and the bottom portion;
a dielectric interlayer conformally disposed on the bottom electrode and at least partially in the top portion and the bottom portion; and
a top electrode disposed on the dielectric interlayer.

2. The semiconductor structure of claim 1, wherein the side surface of the top portion is curved.

3. The semiconductor structure of claim 1, wherein the side surface of the bottom portion is substantially straight.

4. The semiconductor structure of claim 1, wherein the top portion has a first height, the bottom portion has a second height, and the second height is greater than the first height.

5. The semiconductor structure of claim 1, wherein the substrate comprises a doped region, and the top portion and the bottom portion are disposed in the doped region.

6. The semiconductor structure of claim 1, wherein the top portion is a ring in shape, the bottom portion is a ring in shape, and the dielectric material disposed in the top portion and the bottom portion is a ring in shape.

7. A semiconductor structure, comprising:
a substrate; and
a filler disposed in the substrate and having a funnel-shaped portion, wherein the filler is conductive and comprises a top portion and a bottom portion in contact with the top portion, the top portion has a convex side surface extending from the bottom portion, and has a first top width greater than a second top width of the bottom portion, wherein an air gap is formed in the funnel-shaped portion.

8. A method of fabricating a semiconductor structure, comprising:
forming a top hole extending from a top surface of a substrate into the substrate and tapering toward a bottom surface of the substrate, wherein the top hole is concave;
forming a bottom hole extending from a bottom of the top hole into the substrate;
forming a filler in the top hole and the bottom hole;
introducing a dopant into a conductive region adjacent the bottom hole to form a conductive doped region; and
thinning the substrate from the bottom surface of the substrate to expose the filler and the conductive doped region.

9. The method of claim 8, wherein forming the top hole and the bottom hole comprises:
forming a patterned mask layer having an opening on the top surface of the substrate;
etching the substrate through the opening by an isotropic etching to form the top hole; and
etching the substrate through the opening by an anisotropic etching to form the bottom hole.

10. The method of claim 8, wherein forming the bottom hole extending from the bottom of the top hole into the substrate stops before the bottom hole penetrates through the substrate.

11. The method of claim 8, wherein forming the bottom hole extending from the bottom of the top hole into the substrate stops until the bottom hole penetrates through the substrate.

12. The method of claim 8, wherein forming the top hole includes surrounding the conductive region by the top hole.

13. The method of claim 8, wherein forming the bottom hole includes surrounding the conductive region by the bottom hole.

14. The method of claim 8, further comprising forming a semiconductor device in the substrate.

15. The method of claim 14, wherein forming the semiconductor device includes forming a transistor.

16. The method of claim 14, wherein forming the filler is before forming the semiconductor device.

17. The method of claim 14, wherein introducing the dopant is before forming the semiconductor device.

18. The method of claim 8, further comprising forming an interconnection structure electrically connected to a bottom surface of the conductive doped region.

19. The method of claim 8, further comprising forming an interconnection structure electrically connected to a top surface of the conductive doped region.

20. The method of claim 8, further comprising forming the bottom hole extending from the bottom of the top hole into the substrate to form a funnel-shaped blind hole.

* * * * *